(12) United States Patent
Chih et al.

(10) Patent No.: US 11,294,764 B2
(45) Date of Patent: *Apr. 5, 2022

(54) METHOD OF CORRECTING ERRORS IN A MEMORY ARRAY AND METHOD OF SCREENING WEAK BITS IN THE SAME

(71) Applicant: TAIWAN SEMICONDUCTOR MANUFACTURING COMPANY, LTD., Hsinchu (TW)

(72) Inventors: Yu-Der Chih, Hsinchu (TW); Chia-Fu Lee, Hsinchu (TW); Chien-Yin Liu, Hsinchu (TW); Yi-Chun Shih, Taipei (TW); Kuan-Chun Chen, Hsinchu (TW); Hsueh-Chih Yang, Hsinchu (TW); Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 34 days.

This patent is subject to a terminal disclaimer.

(21) Appl. No.: 16/786,795

(22) Filed: Feb. 10, 2020

(65) Prior Publication Data

US 2020/0174883 A1 Jun. 4, 2020

Related U.S. Application Data

(63) Continuation of application No. 15/634,876, filed on Jun. 27, 2017, now Pat. No. 10,558,525.

(Continued)

(51) Int. Cl.
*G06F 11/10* (2006.01)
*H03M 13/29* (2006.01)
(Continued)

(52) U.S. Cl.
CPC ...... *G06F 11/1076* (2013.01); *G06F 11/1012* (2013.01); *G06F 11/1048* (2013.01);
(Continued)

(58) Field of Classification Search
CPC ............. G06F 11/1076; G06F 11/1048; G06F 11/1012; H03M 13/2927; H03M 13/2909;
(Continued)

(56) References Cited

U.S. PATENT DOCUMENTS 7,036,059 B1 * 4/2006 Carmichael ......... G06F 11/1004
714/725
2003/0089978 A1 5/2003 Miyamoto
(Continued)

FOREIGN PATENT DOCUMENTS

CN 103329104 9/2013
CN 103797541 5/2014
(Continued)

OTHER PUBLICATIONS

Notice of Allowance dated Oct. 22, 2018 from corresponding application No. TW 106121785.
(Continued)

*Primary Examiner* — Cynthia Britt
(74) *Attorney, Agent, or Firm* — Hauptman Ham, LLP

(57) ABSTRACT

A method of screening weak bits in a memory array. The method includes storing a first set of data in a first memory array of the memory array, performing a first baking process on at least the first memory array or applying a first magnetic field to at least the first memory array, tracking an address of at least a first memory cell of a first set of memory cells of the first memory array, if the first memory cell of the first set of memory cells stores altered data, and at least one of replacing the first memory cell of the first set of memory cells storing the altered data with a corresponding memory
(Continued)

cell in a second memory array of the memory array, or discarding the first memory cell of the first set of memory cells storing the altered data.

20 Claims, 12 Drawing Sheets

Related U.S. Application Data

(60) Provisional application No. 62/356,796, filed on Jun. 30, 2016.

(51) Int. Cl.
    *H03M 13/15*    (2006.01)
    *H03M 13/19*    (2006.01)
    *G11C 29/42*    (2006.01)

(52) U.S. Cl.
    CPC ... *H03M 13/2906* (2013.01); *H03M 13/2909* (2013.01); *H03M 13/2927* (2013.01); *G11C 29/42* (2013.01); *H03M 13/152* (2013.01); *H03M 13/1515* (2013.01); *H03M 13/19* (2013.01)

(58) Field of Classification Search
    CPC ......... H03M 13/2906; H03M 13/1515; H03M 13/19; H03M 13/152; G11C 29/42
    See application file for complete search history.

(56) References Cited

U.S. PATENT DOCUMENTS

| | | |
|---|---|---|
| 2004/0062086 A1* | 4/2004 | Watanabe ............ G11C 29/027 365/200 |
| 2011/0075482 A1 | 3/2011 | Shepard et al. |
| 2011/0197110 A1 | 8/2011 | Kanno |
| 2012/0151294 A1 | 6/2012 | Yoo et al. |
| 2012/0204077 A1 | 8/2012 | D'Abreu |
| 2013/0039129 A1 | 2/2013 | Radke et al. |
| 2013/0275832 A1 | 10/2013 | D'Abreu et al. |
| 2013/0308390 A1 | 11/2013 | Lee |
| 2015/0135023 A1 | 5/2015 | Mekhanik et al. |
| 2015/0179281 A1* | 6/2015 | Lu .......................... G06F 11/073 714/718 |
| 2016/0099078 A1 | 4/2016 | Luo et al. |
| 2016/0118112 A1 | 4/2016 | Liang et al. |
| 2017/0117061 A1* | 4/2017 | Sharon .................. G11C 29/44 |
| 2018/0039537 A1 | 2/2018 | Chih |
| 2018/0205396 A1 | 7/2018 | Ikegawa |

FOREIGN PATENT DOCUMENTS

| | | |
|---|---|---|
| KR | 20120064462 | 6/2012 |
| KR | 20130101149 | 9/2013 |

OTHER PUBLICATIONS

Search Report dated Oct. 1, 2018 from corresponding application No. TW 106121785.
Office Action dated Nov. 4, 2019 from corresponding application No. CN 201710508727.4.
Office Action dated Mar. 21, 2018 from corresponding No. KR 10-2017-0082827.

\* cited by examiner ized embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

METHOD OF CORRECTING ERRORS IN A MEMORY ARRAY AND METHOD OF SCREENING WEAK BITS IN THE SAME

PRIORITY CLAIM

The present application is a continuation of U.S. application Ser. No. 15/634,876, filed Jun. 27, 2017, now U.S. Pat. No. 10,558,525, issued Feb. 11, 2020, which claims priority to U.S. Provisional Patent Application No. 62/356,796, filed on Jun. 30, 2016, the disclosure of which are incorporated herein by reference in their entireties.

BACKGROUND

The semiconductor integrated circuit (IC) industry has produced a wide variety of digital devices to address issues in a number of different areas. Some of these digital devices, such as memory arrays, are configured for the storage of data. During the manufacturing process of memory arrays, portions of the memory array are damaged or contain corrupted data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
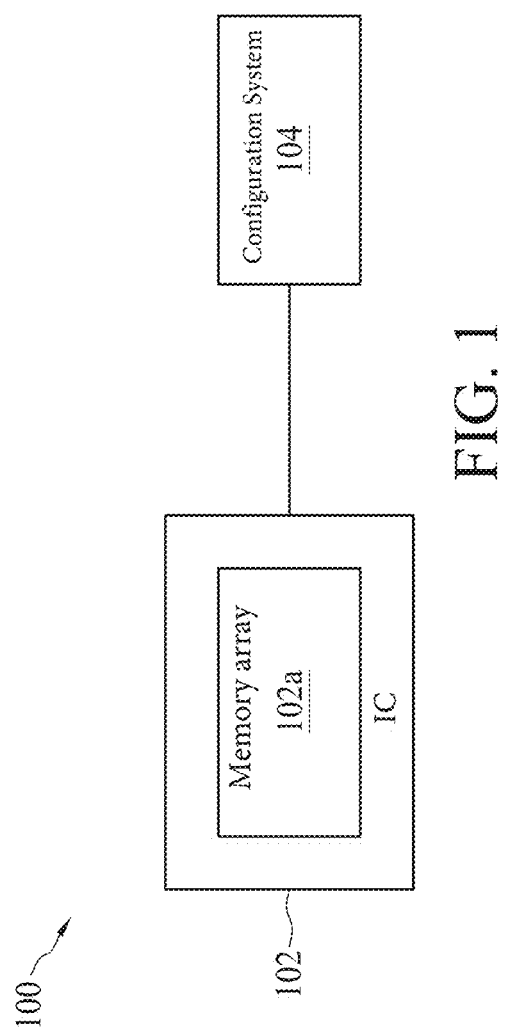
FIG. 1 is a block diagram of a memory system, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory array is subject to a reflow process. In accordance with some embodiments, a reflow process is a process in which solder paste is used to temporarily attach at least one electrical component in the memory array to at least one contact pad. Afterwards, the entire assembly is subjected to controlled heat, which melts the solder and provides a permanent connection between the at least one electrical component to the at least one contact pad. However, the reflow process can corrupt data contained in the memory array or can corrupt memory cells within the memory array.

In accordance with some embodiments, a method of correcting errors in a memory array includes configuring a first memory array with a first error correction code (ECC) to provide error correction of data stored in the first memory array, configuring a second memory array with a second ECC to provide error correction of the data stored in the first memory array, performing a reflow process on the first memory array and the second memory array, and correcting data stored in the first memory array based on at least the first ECC or the second ECC. In accordance with some embodiments, the first memory array and the second memory array are portions of the memory array. In accordance with some embodiments, the first ECC or the second ECC are utilized to correct bit errors introduced from the reflow process.

FIG. 1 is a block diagram of a memory system 100, in accordance with some embodiments.

Memory system 100 includes an integrated circuit (IC) 102 electrically coupled to a configuration system 104. IC 102 includes a memory array 102a configured to store data. In some embodiments, IC 102 includes other circuitry or is configured to store or execute software which, for simplicity, is not shown. In some embodiments, IC 102 is configured to repair or detect an error in data stored in memory array 102a. Repairing an error includes overwriting the data with correct data provided by an error correcting code (ECC) or flipping the logic value of the existing data in a failed location in memory array 102a.

Memory array 102a includes a plurality of banks of memory cells. Each bank includes a number of rows, a number of columns and related circuitry such as sense amplifiers, word lines, bit lines, or the like. Depending on application, the size of memory 102a includes, for example, 1, 2, 4 megabytes (Mb), or the like. Other memory sizes are within the scope of various embodiments. In some embodiments, a row of memory cells is called a data word. Various embodiments of the disclosure provide mechanisms for repairing, using one or more ECCs, the errors which occur in memory array 102a. Memory array 102a is a non-volatile memory. In some embodiments, memory array 102a includes resistive random access memory (RRAM), magnetoresistive RAM (MRAM), phase-change RAM (PRAM), ferroelectric RAM (FRAM), or other suitable memory types. Other memory types are within the scope of various embodiments.

Figure 7:
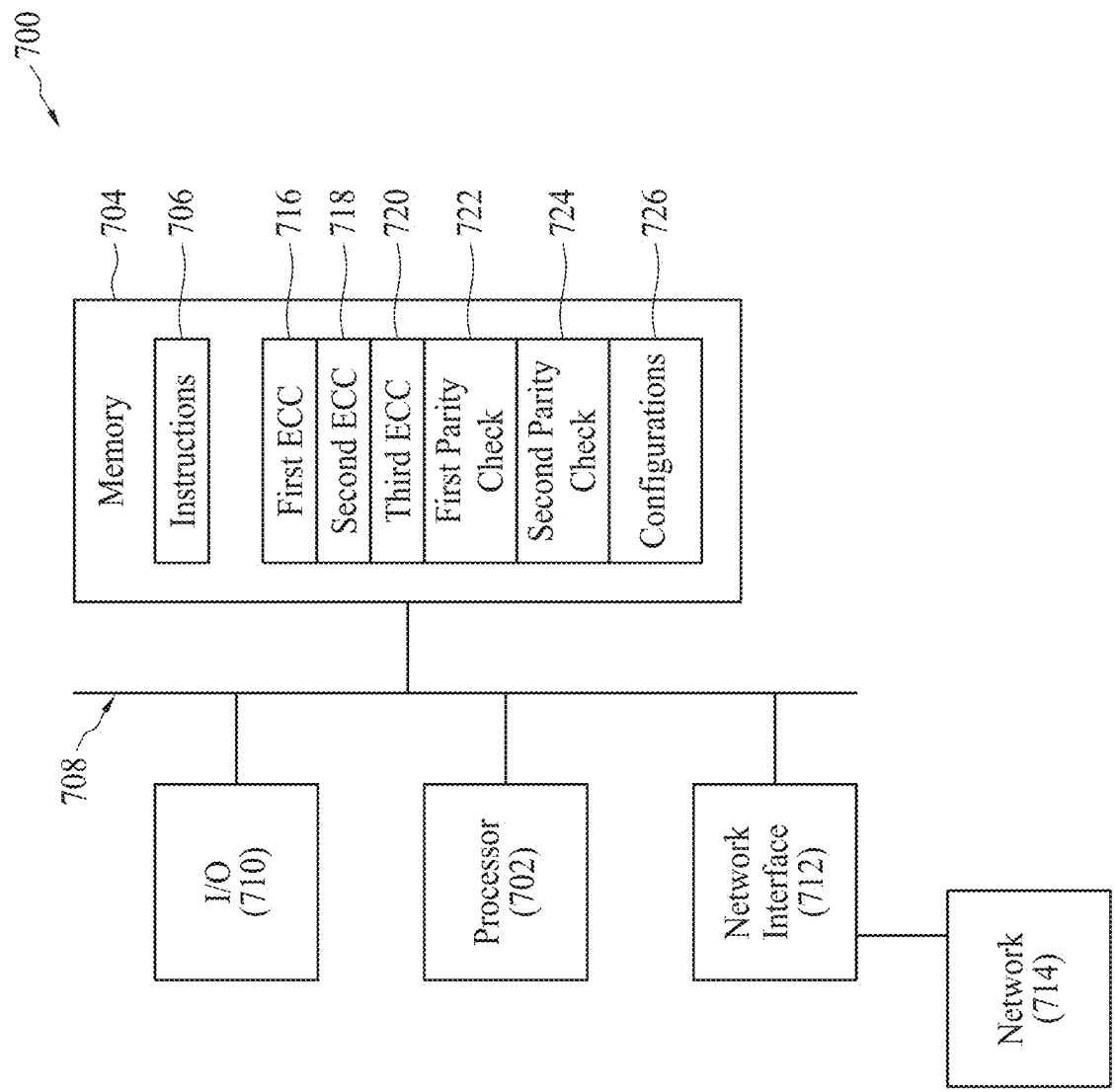
FIG. 7 is a block diagram of a system for configuring a memory array, in accordance with some embodiments.

Configuration system 104 interfaces with integrated circuit 102 for configuring memory array 102a with one or more ECC configurations or error detecting configurations. In some embodiments, configuration system 104 includes a hardware processor and a non-transitory, computer readable storage medium encoded with, i.e., storing, a set of executable instructions. An embodiment of configuration system 104 is shown in FIG. 7 as system 700. Configuration system 104 is separate from IC 102. In some embodiments, configuration system 104 is part of IC 102.

Figure 2:
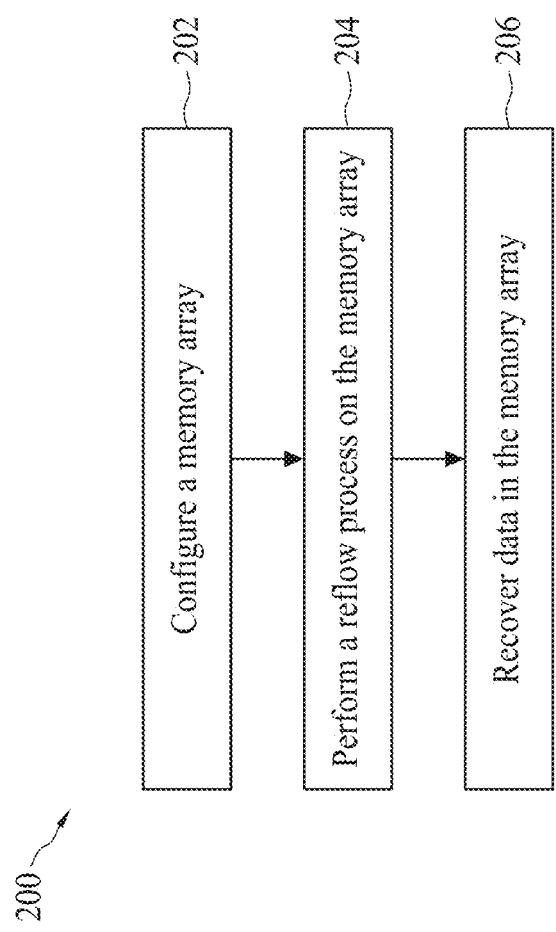
FIG. 2 is a flowchart of a method of correcting errors in a memory system, in accordance with some embodiments.

FIG. 2 is a flowchart of a method 200 of correcting errors in memory system 100 in accordance with some embodiments. It is understood that additional operations may be performed before, during, and/or after method 200 depicted in FIG. 2, and that some other operations may only be briefly described herein. In some embodiments, method 200 is usable to configure IC 102 (FIG. 1) with an ECC and to correct errors in memory array 102a based on at least the ECC.

In operation 202 of method 200, a memory array 102a is configured. In some embodiments, memory array 102a is configured with error correction to enable correction of one or more errors in data stored in memory array 102a. For example, in some embodiments, memory array 102a is configured with an ECC to correct one or more errors in data stored in memory array 102a. In some embodiments, the ECC includes a Hamming ECC, a Reed-Solomon ECC, a BCH code, or the like. In some embodiments, memory array 102a is configured with error detection to enable detection of one or more errors in data stored in memory array 102a. In some embodiments, error detection includes parity checking to detect one or more bit errors in data stored in memory array 102a. Other ECCs or error detection methods are within the scope of various embodiments.

Method 200 continues with operation 204, where a reflow process is performed on memory array 102a. In some embodiments, the reflow process of operation 204 includes placing memory array 102a into a reflow oven, and heating the reflow oven at a first temperature T1 for a first duration D1. In some embodiments, the reflow process of operation 204 includes exposing memory array 102a to an infrared lamp, and heating the memory array 102a by the infrared lamp at the first temperature T1 for the first duration D1.

Method 200 continues with operation 206, where data in memory array 102a is recovered. In some embodiments, the data in memory array 102a is recovered by IC 102 by use of the ECC. In some embodiments, the ECC includes at least a first ECC, a second ECC or a third ECC. In some embodiments, the data in memory array 102a is recovered by IC 102 by using a first parity check and a second parity check.

Figure 3A:
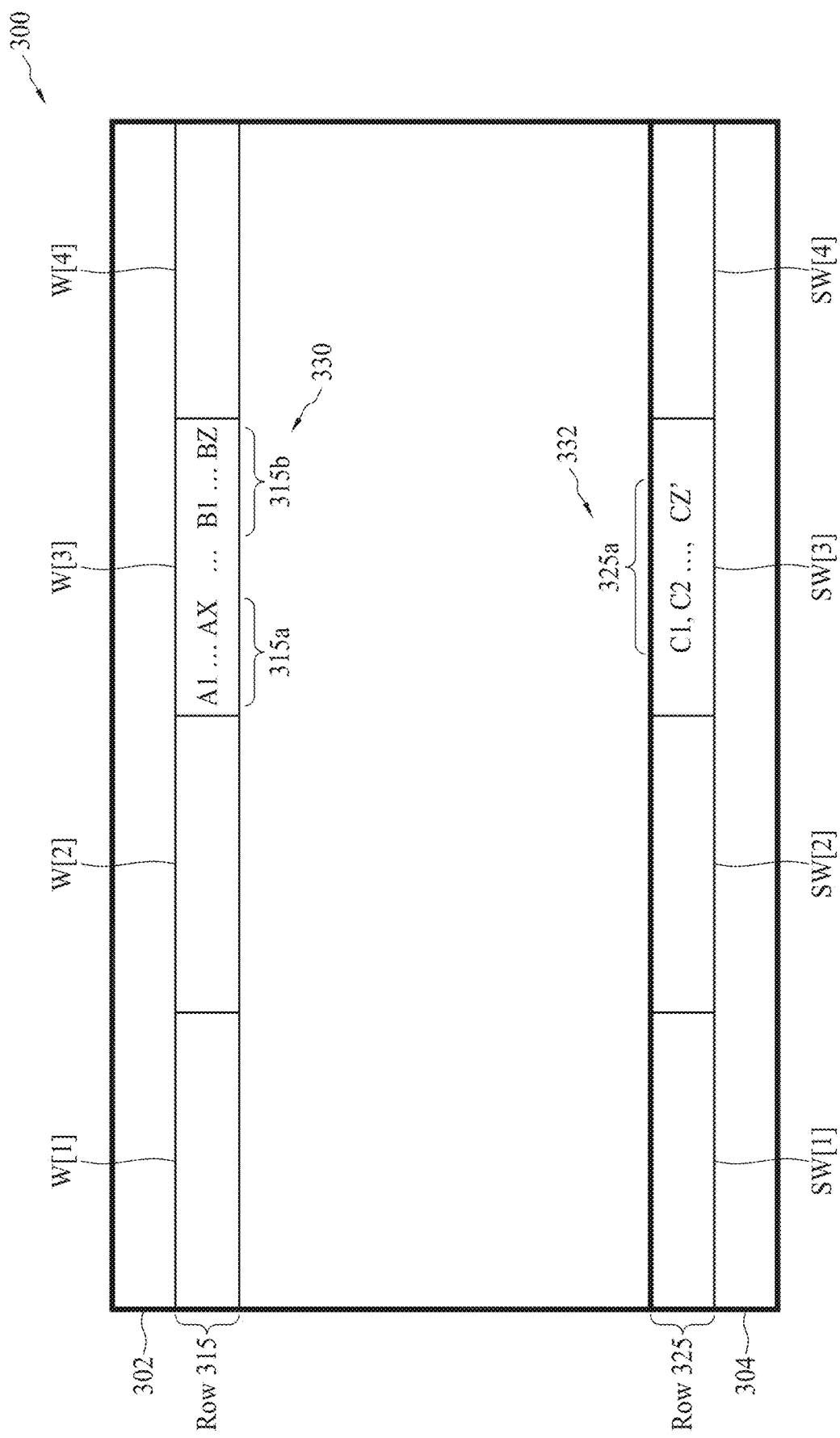
FIG. 3A is a diagram of a portion of a memory array, in accordance with some embodiments.

FIG. 3A is a diagram of a portion of a memory array 300, in accordance with some embodiments.

Memory array 300 is an embodiment of memory array 102a of FIG. 1. Memory array 300 includes a first memory array 302 and a second memory array 304.

First memory array 302 is directly next to second memory array 304. In some embodiments, first memory array 302 is separated from second memory array 304 by another region (not shown). First memory array 302 and second memory array 304 are part of the same memory array 300. In some embodiments, first memory array 302 and second memory array 304 are corresponding portions of different memory arrays.

First memory array 302 includes a first set of memory cells arranged in rows and columns. Each row of memory cells in the first set of memory cells includes a first set of memory words. For illustration, one row 315 of memory cells is shown, but the teachings of row 315 are applicable to each of the rows of memory cells in first memory array 302. A row 315 of memory cells in the first set of memory cells includes a first set of memory words W[1], W[2], W[3] or W[4] (collectively referred to as words "W"). Common numbers of words W in a row include 8, 16, 32, 64, or the like. A different number of words W in a row of memory cells of the first set of memory cells is within the scope of various embodiments. Each word of the first set of memory words W includes a plurality of memory cells or a plurality of memory bits. Word W[3] includes a first set of bits 315a and a second set of bits 315b. For simplicity, memory bits in words W[1], W[2], and W[4] are not shown.

First set of bits 315a includes bits A1 . . . , AX, where X is a positive integer corresponding to the number of bits of data in first set of bits 315a in word W[3].

Second set of bits 315b includes bits B1 . . . , BZ, where Z is a positive integer corresponding to the number of bits in second set of bits 315b. Second set of bits 315b is referred to as a first ECC 330 configured to provide N-bits of error correction in the first set of bits 315a of word W[3], where N is a positive integer corresponding to the number of bits of error correction provided by the first ECC 330. In some embodiments, the size of N is a design choice based upon the size of the first memory array 302. For example, in some embodiments, as the size of the first memory array 302 is increased, the size of N can also be increased since the first memory array 302 has more memory cells capable of storing more data. For example, in some embodiments, as the size of the first memory array 302 is decreased, the size of N can also be decreased since the first memory array 302 has less memory cells capable of storing less data.

Second memory array 304 is configured with a second ECC 332 configured to provide error correction of the data stored in the first memory array 302. Second memory array 304 includes a second set of memory cells arranged in rows and columns. Each row of memory cells in the second set of memory cells includes a second set of memory words. For illustration, one row 325 of memory cells is shown, but the teachings of row 325 are applicable to each of the rows of memory cells in second memory array 304. A row 325 of memory cells in the second set of memory cells includes a second set of memory words SW[1], SW[2], SW[3] or SW[4] (collectively referred to as words "SW"). In some embodiments, each row of memory cells in the second set of memory cells has a corresponding row of memory cells in the first set of memory cells. Common numbers of words SW in a row include 8, 16, 32, 64, or the like. A different number of words SW in a row of memory cells of the second set of memory cells is within the scope of various embodiments. Each word of the second set of memory words SW includes a plurality of memory cells or a plurality of bits. Word SW[3] includes a first set of bits 325a. For simplicity, memory bits in words SW[1], SW[2], and SW[4] are not shown. Each word in the first set of words W has a corresponding word in the second set of words SW. Each word in the second set of words SW is configured with a second ECC 332 to provide error correction of at least a corresponding portion of a word in the first set of words W. For simplicity, the second ECC 332 in each of words SW[1], SW[2], and SW[4] is not shown.

First set of bits 325a includes bits C1, C2 ..., CZ', where Z' is a positive integer corresponding to the number of bits of data in first set of bits 325a in word SW[3]. First set of bits 325a is referred to as a second ECC 332 configured to provide M1-bits of error correction in the first set of bits 315a of word W[3]. In some embodiments, second ECC 332 is configured to provide M1-bits of error correction in the first set of bits 315a and the second set of bits 315b of word W[3]. M1 is a positive integer greater than integer N. M1 corresponds to the number of bits of error correction provided by the second ECC 332. In some embodiments, the size of M1 is a design choice based upon the size of the second memory array 304. For example, in some embodiments, as the size of the second memory array 304 is increased, the size of M1 can also be increased since the second memory array 304 has more memory cells capable of storing more data. For example, in some embodiments, as the size of the second memory array 304 is decreased, the size of M1 can also be decreased since the second memory array 304 has less memory cells capable of storing less data.

Integer M1 is expressed by formula 1:

$$M1 = N + M \qquad (1)$$

where M is a positive integer corresponding to the number of bits of extra protection provided by second ECC 332 to word W[3], compared with the first ECC 330. For example, in some embodiments, since M1 is greater than N by M, the second ECC 332 provides M bits of extra protection to word W[3] when compared with the first ECC 330 (which provides N bits of protection).

In some embodiments, first memory array 302 and second memory array 304 have a same number of rows or columns of memory cells. In some embodiments, first memory array 302 and second memory array 304 have a different number of rows or columns of memory cells. In some embodiments, second memory array 304 is a spare memory array configured to store temporary data. Different locations of first memory array 302 and second memory array 304 are within the scope of various embodiments. Different locations of first set of words W or first ECC 330 in first memory array 302 and second set of words SW or second ECC 332 in second memory array 304 are within the scope of various embodiments. Different locations of row 315 in first memory array 302 and row 325 in second memory array 304 are within the scope of various embodiments.

Figure 3B:
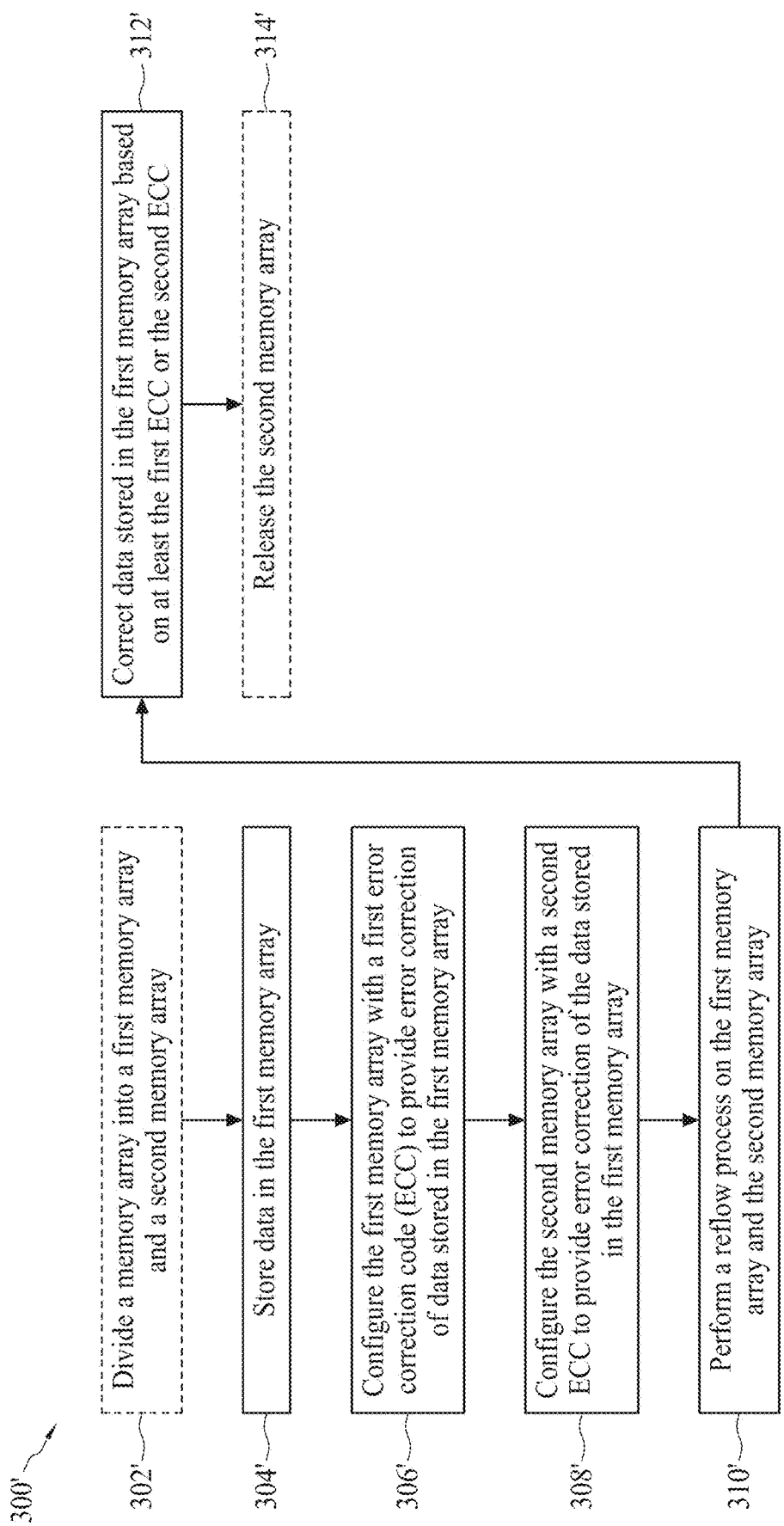
FIG. 3B is a flowchart of a method of correcting errors in a memory array, in accordance with some embodiments.

FIG. 3B is a flowchart of a method 300' of correcting errors in a memory array 300 in accordance with some embodiments.

Method 300' is an embodiment of method 200 of FIG. 2 with similar elements. For simplicity, method 300' is applied to word W[3] and word SW[3] in FIG. 3A, but in some embodiments, method 300' is also applicable to each of the rows of memory cells in first memory array 302 or second memory array 304.

In operation 302' of method 300', a memory array 300 (FIG. 3A) is divided into a first memory array 302 and a second memory array 304.

Method 300' continues with operation 304', where data is stored in the first memory array 302. In some embodiments, data stored in the first memory array 302 corresponds to the first set of bits 315a. In some embodiments, data stored in the first memory array 302 corresponds to a portion of word W[3]. In some embodiments, IC 102 is configured to store data in the first memory array 302. In some embodiments, configuration system 104 is configured to store data in the first memory array 302.

Method 300' continues with operation 306', where the first memory array 302 is configured with a first ECC 330 to provide error correction of data stored in the first memory array 302. In some embodiments, the first ECC 330 is configured to provide error correction of data (e.g., first set of bits 315a) stored in the first memory array 302. The first ECC 330 is stored in the first memory array 302 as the second set of bits 315b.

Method 300' continues with operation 308', where the second memory array 304 is configured with a second ECC 332 to provide error correction of at least a portion of the data (e.g., first set of bits 315a) stored in the first memory array 302. In some embodiments, the first ECC 330 or the second ECC 332 includes a Hamming ECC, a Reed-Solomon ECC a BCH code, or the like. Other ECCs are within the scope of various embodiments. In some embodiments, configuration system 104 configures at least the first memory array 302 with the first ECC 330 or the second memory array 304 with the second ECC 332 (e.g., second set of bits 325a). Operations 304', 306' and 308' are embodiments of operation 202 (FIG. 2).

Method 300' continues with operation 310', where a reflow process is performed on the first memory array 302 and the second memory array 304. The reflow process of operation 310' is similar to the reflow process of operation 204 (FIG. 2).

In some embodiments, the reflow process of operation 310' corrupts portions of the data stored in the first memory array 302. In some embodiments, portions of the data stored in the first memory array 302 are corrupted prior to the reflow process. In some embodiments, the reflow process of operation 310' corrupts memory cells in the first memory array 302 such that the corrupted memory cells do not operate properly.

Method 300' continues with operation 312', where data (e.g., first set of bits 315a of word W[3]) stored in the first memory array 302 is corrected based on at least the first ECC 330 or the second ECC 332. In some embodiments, the second ECC 332 corrects both the first set of bits 315a and the first ECC 330, and therefore the corrected data of operation 312' includes first set of bits 315a and second set of bits 315b.

In some embodiments, if the number of bit errors in at least a portion of a word of first set of words W in the first memory array 302 is less than or equal to N bits, then the data (e.g., first set of bits 315a) stored at the word of the first set of words W in first memory array 302 is corrected based on the first ECC 330. For example, in some embodiments, if the number of bit errors in word W[3] of the first set of words W in the first memory array 302 is less than or equal to N bits, then at least a portion of the data stored at word W[3] (e.g., first set of bits 315a) in the first memory array 302 is corrected based on the first ECC 330.

In some embodiments, if the number of bit errors in at least a portion of a word of the first set of words W in the first memory array 302 is greater than N bits and less than or equal to M1 bits, then the data (e.g., first set of bits 315a or second set of bits 315b) stored at the word of the first set of words in the first memory array 302 is corrected based on the second ECC 332. For example, in some embodiments, if the number of bit errors in word W[3] of the first set of words W in the first memory array 302 is greater than N bits and less than or equal to M1 bits, then the data (e.g., first set of bits 315*a* or second set of bits 315*b*) stored at word W[3] in the first memory array 302 is corrected based on the second ECC 332. Operation 312' is an embodiment of operation 206 (FIG. 2).

Method 300' continues with operation 314', where at least a portion (e.g., first set of bits 325*a*) of the second memory array 304 is released. For example, in some embodiments, a released memory array is a memory array including memory cells capable of being written to or overwritten by IC 102. In some embodiments, after data in the first memory array 302 is restored by first memory array 302 or second memory array 304, the second memory array 304 is released. In some embodiments, IC 102 releases the second memory array 304. In some embodiments, operation 314' comprises designating at least a portion of the second memory array 304 as memory cells available to be written to by IC 102 or other circuits. In some embodiments, operation 302' or 314' is not performed.

Using at least one of the presently disclosed methods, the error correcting advantages in a memory array (e.g., memory array 102*a*, memory array 300 of FIG. 3A, memory array 400A of FIG. 4A, memory array 400B of FIG. 4B or memory array 500 of FIG. 5A) are greater than other approaches because the memory array (e.g., memory array 102*a*, memory array 300 of FIG. 3A, memory array 400A of FIG. 4A, memory array 400B of FIG. 4B or memory array 500 of FIG. 5A) is configured with error correction codes (e.g., first ECC 330, second ECC 332, 432, 434, 530 or third ECC 532) and/or parity (e.g., first parity check 420 or 424, or second parity check 422) capable of correcting errors in the data stored in the first memory array (e.g., first memory array 302, 402 or 502). In some embodiments, by using error correction codes (e.g., first ECC 330, second ECC 332, 432, 434, 530 or third ECC 532) and/or parity (e.g., first parity check 420 or 424, or second parity check 422), memory array (e.g., memory array 102*a*, 300, 400A, 400B or 500) has a lower bit error rate (BER) and lower field return rate than other approaches. In some embodiments, a field return rate is the failure rate of a memory array die in an integrated circuit after the reflow process. Using at least one of the presently disclosed methods, the ECC (e.g., first ECC 330, second ECC 332, 432, 434, 530 or third ECC 532) or parity (e.g., first parity check 420 or 424, or second parity check 422) is utilized to correct bit errors in a memory array (e.g., memory array 102*a*, 300, 400A, 400B or 500) introduced from a reflow process, a baking process or application of a magnetic field or other processes. Other processes, components, materials, values, steps, arrangements, etc., are contemplated.

Figure 4A:
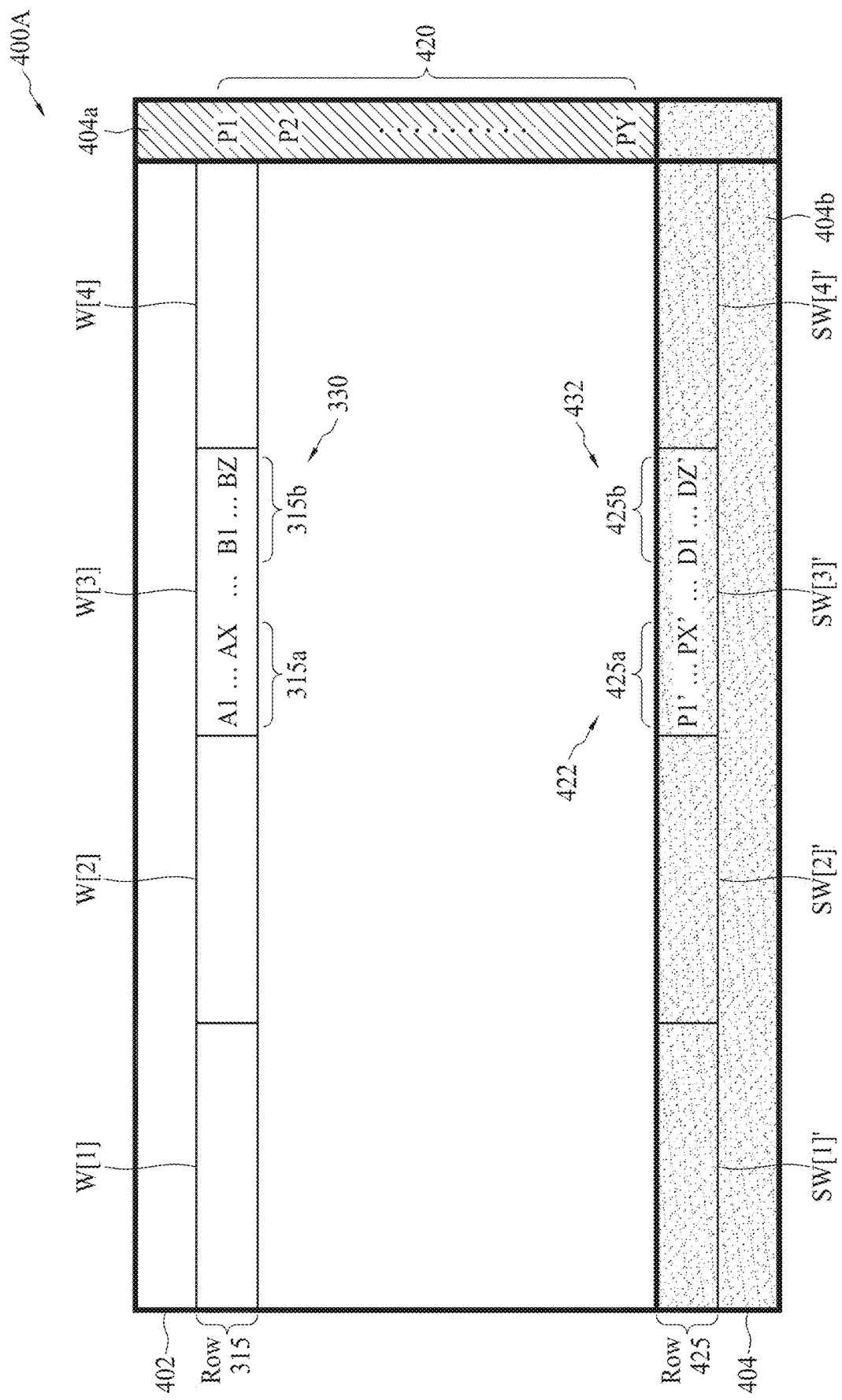
FIG. 4A is a diagram of a portion of a memory array, in accordance with some embodiments.

FIG. 4A is a diagram of a memory array 400A, in accordance with some embodiments.

Memory array 400A is an embodiment of memory array 102*a* of FIG. 1A. Memory array 400A is a variation of memory array 300 of FIG. 3A. Memory array 400A includes a first memory array 402 and a second memory array 404.

First memory array 402 is first memory array 302 (FIG. 3). Second memory array 404 is a variation of second memory array 304 (FIG. 3).

Second memory array 404 includes a first portion 404*a* and a second portion 404*b*.

The first portion 404*a* includes a second set of memory cells arranged in a column. The column of memory cells are configured to store a first set of data P1, P2, . . . , PY, (collectively referred to as first set of data "P"), where Y is a positive integer corresponding to the number of bits in the first set of data P or the number of rows of memory cells in first memory array 402.

First set of data P is configured as a first set of parity bits in a first parity check 420. First parity check 420 is configured to provide parity error detection of the data (e.g., row 315, first set of bits 315*a* or second set of bits 315*b*) stored in each of the rows of the first memory array 402. First parity check 420 is even or odd parity. Each row of parity data in the first set of data P corresponds to the parity check of the corresponding row of data in first memory array 402.

The second portion 404*b* of the second memory array 404 is configured with a second parity check 422 and a second ECC 432. The second portion 404*b* includes a third set of memory cells arranged in rows and columns. Each row of memory cells in the third set of memory cells includes a second set of memory words. For illustration, one row 425 of memory cells is shown, but the teachings of row 425 are applicable to each of the rows of memory cells in the second portion 404*b* of second memory array 404. A row 425 of memory cells in the third set of memory cells includes a second set of memory words SW[1]', SW[2]', SW[3]' or SW[4]' (collectively referred to as words "SW"). In some embodiments, each row of memory cells in the third set of memory cells has a corresponding row of memory cells in the first set of memory cells in first memory array 402. Common numbers of words SW' in a row include 8, 16, 32, 64, or the like. A different number of words SW' in a row of memory cells of the third set of memory cells is within the scope of various embodiments. Each word of the second set of memory words SW' includes a plurality of memory cells or a plurality of memory bits. Word SW[3]' includes a first set of bits 425*a* and a second set of bits 425*b*. For simplicity, bits in words SW[1]', SW[2]', and SW[4]' are not shown. Each word in the second set of words SW' has a corresponding word in the first set of words W.

First set of bits 425*a* includes bits P1', . . . , PX', where X' is a positive integer corresponding to the number of bits of data in first set of bits 425*a* in word SW[3]'. First set of bits 425*a* is configured as a second set of parity bits in a second parity check 422. Second parity check 422 is configured to provide parity error detection of the data stored in each of the columns of first memory array 402. Second parity check 422 is even or odd parity. In some embodiments, each word in the second set of words SW' is associated with a corresponding column of memory cells in the first memory array 402. In some embodiments, a portion (e.g., first set of bits 425*a*) of each word in the second set of words SW' is a second parity check 422 of a corresponding column of memory cells in the first memory array 402.

Second set of bits 425*b* includes bits D1 . . . , DZ', where Z' is a positive integer corresponding to the number of bits in second set of bits 425*b*. Second set of bits 425*b* is referred to as a second ECC 432 configured to provide N1-bits of error correction in the first set of bits 425*a* of word SW[3]', where N1 is a positive integer. N1 corresponds to the number of bits of error correction provided by the second ECC 432. In some embodiments, the size of N1 is a design choice based upon the size of the second memory array 404. For example, in some embodiments, as the size of the second memory array 404 is increased, the size of N1 can also be increased since the second memory array 404 has more memory cells capable of storing more data. For example, in some embodiments, as the size of the second memory array 404 is decreased, the size of N1 can also be decreased since the second memory array 404 has less memory cells capable of storing less data. Each word in the second set of words SW' is configured with the second ECC 432 to provide error correction of a portion (e.g., first set of bits 425*a*) of a word (e.g., SW[3]') in the second set of words SW'. For simplicity, the second ECC in each of words SW[1]', SW[2]' and SW[4]' is not shown.

In some embodiments, first memory array 402 and second memory array 404 have a same number of rows or columns of memory cells. In some embodiments, first memory array 402 and second memory array 404 have a different number of rows or columns of memory cells. In some embodiments, second memory array 404 corresponds to a spare memory array configured to store temporary data. Different locations of first memory array 402 and second memory array 404 are within the scope of various embodiments. Different locations of first portion 404*a* or second portion 404*b* are within the scope of various embodiments. Different locations of first set of words W or first ECC 330 in first memory array 402 and second set of words SW' or second ECC 432 in second memory array 404 are within the scope of various embodiments. Different locations of row 315 in first memory array 402 and row 425 in second memory array 404 are within the scope of various embodiments. In some embodiments, first ECC 330 is not performed and therefore first memory array 402 does not include first ECC 330, and word W[3] does not include second set of bits 315*b*.

Figure 4B:
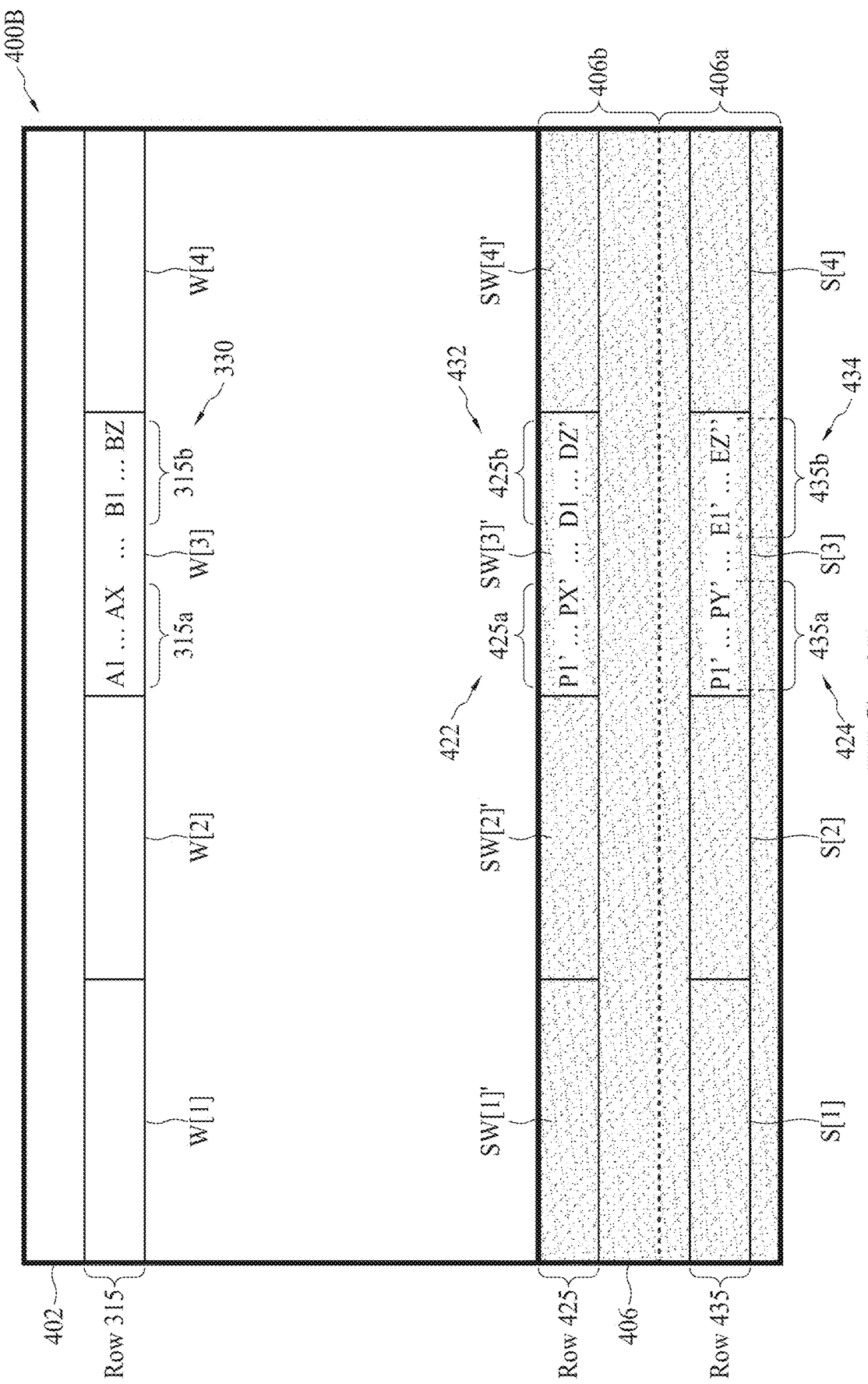
FIG. 4B is a diagram of a portion of a memory array, in accordance with some embodiments.

FIG. 4B is a diagram of a memory array 400B, in accordance with some embodiments.

Memory array 400B is an embodiment of memory array 102*a* of FIG. 1A. Memory array 400B is a variation of memory array 400A of FIG. 4A. Memory array 400B includes first memory array 402 and a second memory array 406. Compared with FIG. 4A, second memory array 406 of FIG. 4B replaces second memory array 404.

Second memory array 406 is a variation of second memory array 404 (FIG. 4A).

Second memory array 406 includes a first portion 406*a* and a second portion 406*b*. Second portion 406*b* is second portion 404*b* of FIG. 4A. First portion 406*a* is a variation of first portion 404*a* of FIG. 4A.

First portion 406*a* includes a fourth set of memory cells arranged in rows and columns. First portion 406*a* is configured with a first parity check 424 and a third ECC 434.

Each row of memory cells in the fourth set of memory cells includes a third set of memory words. For illustration, one row 435 of memory cells is shown, but the teachings of row 435 are applicable to each of the rows of memory cells in the first portion 406*a* of second memory array 406. A row 435 of memory cells in the fourth set of memory cells includes a third set of memory words S[1], S[2], S[3] or S[4] (collectively referred to as words "S"). In some embodiments, each row of memory cells in the fourth set of memory cells has a corresponding row of memory cells in the first set of memory cells in first memory array 402 or the third set of memory cells in the second portion 406*b* of the second memory array 406.

Common numbers of words S in a row include 8, 16, 32, 64, or the like. A different number of words S in a row of memory cells of the fourth set of memory cells is within the scope of various embodiments. Each word of the third set of memory words S includes a plurality of memory cells or a plurality of memory bits. Word S[3] includes a first set of bits 435*a* and a second set of bits 435*b*. For simplicity, memory bits in words S[1], S[2] and S[4] are not shown. In some embodiments, each word in the third set of words S has a corresponding word in the first set of words W or the second set of words W'.

First set of bits 435*a* corresponds to first set of data P in FIG. 4B. First set of bits 435*a* includes bits P1', . . . , PY', where Y' is a positive integer corresponding to the number of bits of data in first set of bits 435*a* in word S[3]. First set of bits 435*a* is configured as a first set of parity bits in a first parity check 424. First parity check 424 is configured to provide parity error detection of the data stored in row 315 of first memory array 402. First parity check 424 is even or odd parity.

In some embodiments, each word in the third set of words S is associated with a corresponding row of memory cells in the first memory array 402. In some embodiments, a portion (e.g., first set of bits 435*a*) of each word in the third set of words S is a first parity check of a corresponding row of memory cells in the first memory array 402. For example, in these embodiments, first parity check 424 is configured to provide parity error detection of the data stored in row 315 of first memory array 402.

Second set of bits 435*b* includes bits E1 . . . , EZ", where Z" is a positive integer corresponding to the number of bits in second set of bits 435*b*. Second set of bits 435*b* is referred to as a third ECC 434 configured to provide N2-bits of error correction in the first set of bits 435*a* of word S[3], where N2 is a positive integer. N2 corresponds to the number of bits of error correction provided by the third ECC 434. In some embodiments, the size of N2 is a design choice based upon the size of the second memory array 406. For example, in some embodiments, as the size of the second memory array 406 is increased, the size of N2 can also be increased since the second memory array 406 has more memory cells capable of storing more data. For example, in some embodiments, as the size of the second memory array 406 is decreased, the size of N2 can also be decreased since the second memory array 406 has less memory cells capable of storing less data. Each word in the third set of words S is configured with the third ECC 434 to provide error correction of a portion (e.g., first set of bits 435*a*) of a word in the third set of words S. For simplicity, the third ECC in each of words S[1], S[2] and S[4] is not shown. In some embodiments, integer N, N1 or N2 is different from another of integer N, N1 or N2.

Different locations of first portion 406*a* or second portion 406*b* are within the scope of various embodiments. Different locations of first set of words W or first ECC 330 in first memory array 402, second set of words SW' or second ECC 432 in second memory array 404, or third set of words S or third ECC 434 in second memory array 404, are within the scope of various embodiments. Different locations of row 315 in first memory array 402 and row 425 or row 435 in second memory array 406 are within the scope of various embodiments. In some embodiments, first ECC 330 is not performed, and therefore first memory array 402 does not include first ECC 330, and word W[3] does not include second set of bits 315*b*.

Figure 4C:
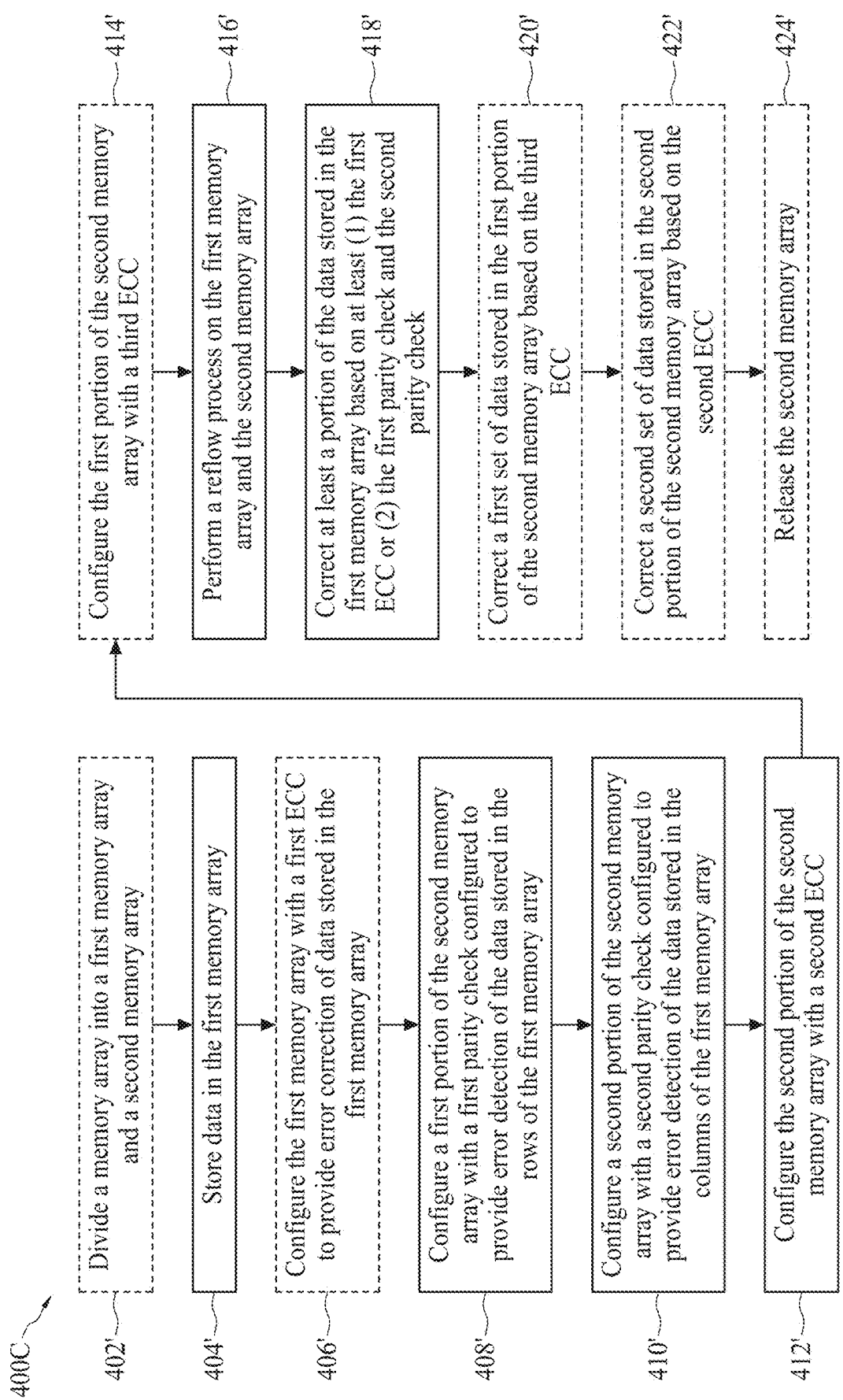
FIG. 4C is a flowchart of a method of correcting errors in a memory array, in accordance with some embodiments.

FIG. 4C is a flowchart of a method 400C of correcting errors in a memory array 400A or 400B in accordance with some embodiments.

Method 400C is an embodiment of method 200 of FIG. 2 with similar elements. For simplicity, method 400C is applied to word W[3], word SW[3]' and S[3] in FIGS. 4A-4B, but in some embodiments, method 400C is applicable to each of the rows of memory cells in first memory array 402 and second memory array 404 or 406.

In operation 402' of method 400C, a memory array 400A (FIG. 4A) is divided into a first memory array 402 and a second memory array 404. In some embodiments, memory array 400B (FIG. 4B) is divided into a first memory array 402 and a second memory array 406.

Method 400C continues with operation 404', where data is stored in the first memory array 402. In some embodiments, data stored in the first memory array 402 is first set of bits 315a. In some embodiments, data stored in the first memory array 402 is a portion of word W[3]. In some embodiments, IC 102 is configured to store data in the first memory array 402. In some embodiments, configuration system 104 is configured to store data in the first memory array 402.

Method 400C continues with operation 406', where the first memory array 402 is configured with a first ECC 330 to provide error correction of data stored in the first memory array 402. In some embodiments, the first ECC 330 is configured to provide error correction of data (e.g., first set of bits 315a) stored in the first memory array 402. In some embodiments, configuration system 104 configures the first memory array 402 with the first ECC 330. The first ECC 330 is stored in the first memory array 402 as the second set of bits 315b.

Method 400C continues with operation 408', where a first portion 404a of the second memory array 404 (FIG. 4A) is configured with a first parity check 420. The first parity check 420 is configured to provide error detection of the data stored in the rows of the first memory array 402. In some embodiments, operation 408' is applied to memory array 400B of FIG. 4B where the first portion 406a of the second memory array 406 is configured with first parity check 424. In some embodiments, the first portion 404a of the second memory array 404 includes a second set of memory cells configured to store a first set of data P (e.g., first parity check 420). In some embodiments, the first portion 406a of the second memory array 406 includes a second set of memory cells configured to store a first set of data (e.g., first set of bits 435a for word W[3]).

Method 400C continues with operation 410', where a second portion 404b of the second memory array 404 is configured with a second parity check 422. The second parity check 422 is configured to provide error detection of the data stored in the columns of the first memory array 402. In some embodiments, operation 410' is applied to memory array 400B of FIG. 4B where the second portion 406b of the second memory array 406 is configured with second parity check 422. In some embodiments, the second portion 404b of the second memory array 404 or the second portion 406b of the second memory array 406 includes a third set of memory cells configured to store a second set of data (e.g., first set of bits 425a for word SW[3]').

Method 400C continues with operation 412', where the second portion 404b of the second memory array 404 is configured with a second ECC 432 to provide error correction of the data (e.g., first set of bits 425a) stored in the second memory array 404. In some embodiments, configuration system 104 configures second memory array 404 with the second ECC 432 (e.g., second set of bits 425b). In some embodiments, operation 412' is applied to memory array 400B of FIG. 4B where the second portion 406b of the second memory array 406 is configured with second ECC 432 to provide error correction of the data (e.g., first set of bits 425a) stored in the second memory array 406.

Method 400C continues with operation 414', where the first portion 406a of the second memory array 406 of FIG. 4B is configured with a third ECC 434 to provide error correction of a first of data (e.g., first set of bits 435a) stored in the first portion 406a of the second memory array 406. In some embodiments, first set of bits 435a is a set of parity bits.

In some embodiments, the first ECC 330, the second ECC 432 or the third ECC 434 includes a Hamming ECC, a Reed-Solomon ECC, a BCH code, or the like. Other ECCs are within the scope of various embodiments. In some embodiments, configuration system 104 configures second memory array 406 with the third ECC 434 (e.g., second set of bits 435b). Operations 404', 406', 408', 410', 412' and 414' are embodiments of operation 202 (FIG. 2).

Method 400C continues with operation 416', where a reflow process is performed on the first memory array 402 and the second memory array 404 or 406. The reflow process of operation 416' corresponds to the reflow process of operation 204 (FIG. 2). In some embodiments, the reflow process of operation 416' corrupts portions of the data stored in the first memory array 402. In some embodiments, portions of the data stored in the first memory array 402 are corrupted prior to the reflow process. In some embodiments, the reflow process of operation 416' corrupts memory cells in the first memory array 402 such that the corrupted memory cells do not operate properly.

Method 400C continues with operation 418', where at least a portion of the data (e.g., word W[3] or first set of bits 315a) stored in the first memory array 402 is corrected based on at least (1) the first ECC 330, or (2) the first parity check 420 and the second parity check 422. In some embodiments, the corrected data of operation 418' includes first set of bits 315a and second set of bits 315b.

In some embodiments, the first ECC 330 is an N-bit ECC, where N is a positive integer corresponding to the number of bits of error protection provided by the first ECC 330 in at least a word of the first set of memory words W. In some embodiments, operation 418' comprises correcting N bit errors in a word of the first set of words W based on the first ECC 330, and correcting a single bit error in the word of the first set of words W based on combining the first parity check 420 (or first parity check 424 in FIG. 4B) and the second parity check 422. In some embodiments, integer N1 or N2 ranges from 1 to 5, and the first parity check 420 (or first parity check 424 in FIG. 4B) and the second parity check 422 together provide 1 bit to 5 bits of error protection.

In some embodiments, if the number of errors in at least a portion of a word of first set of words W in the first memory array 402 is less than or equal to N bits, then the data (e.g., first set of bits 315a) stored at the word of the first set of words W in first memory array 402 is corrected based on the first ECC 330. For example, in some embodiments, if the number of errors in word W[3] of the first set of words W in the first memory array 302 is less than or equal to N bits, then at least a portion of the data stored at word W[3] (e.g., first set of bits 315a) in the first memory array 402 is corrected based on the first ECC 330.

In some embodiments, if the number of errors in at least a portion of a word of the first set of words W in the first memory array 402 is greater than N bits and less than or equal to N+5 bits, then the first ECC corrects N-bits of error in the word of the first set of words in the first memory array 402, and the combined first parity check 420 (or first parity check 424 in FIG. 4B) and the second parity check 422 correct up to 5 bit errors in the word of the first set of words in the first memory array 402.

Method 400C continues with operation 420', where a first set of data (e.g., first set of bits 435a) stored in the first portion 406a of the second memory array 406 is corrected based on the third ECC 434. In some embodiments, operations 414' and 420' are not applied to memory array 400A of FIG. 4A.

Method 400C continues with operation 422', where a second set of data (e.g., first set of bits 425a) stored in the second portion 404b of the second memory array 404 of FIG. 4A is corrected based on the second ECC 432. In some embodiments, operation 422' is applied to memory array 400B of FIG. 4B where the second set of data (e.g., first set of bits 425a) stored in the second portion 406b of the second memory array 406 of FIG. 4B is corrected based on the second ECC 432.

Method 400C continues with operation 424', where at least a portion of the second memory array 404 or second memory array 406 is released. In some embodiments, operation 424' comprises designating at least a portion of the second memory array 404 or second memory array 406 as memory cells available to be written to by IC 102 or other circuits. In some embodiments, one or more of operations 402', 406', 414', 420', 422' or 424' is not performed.

Figure 5A:
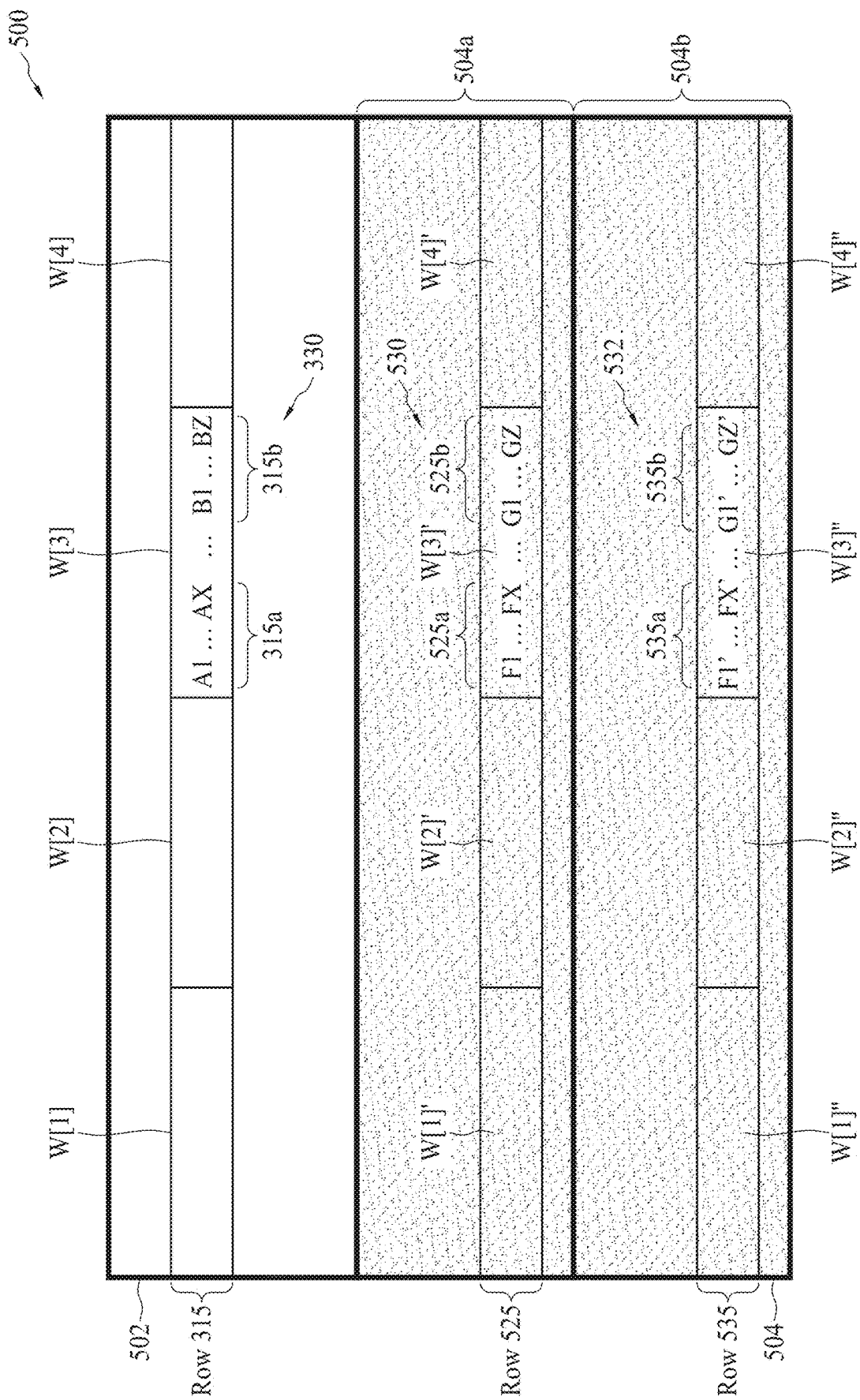
FIG. 5A is a diagram of a portion of a memory array, in accordance with some embodiments.

FIG. 5A is a diagram of a memory array 500, in accordance with some embodiments.

Memory array 500 is an embodiment of memory array 102a of FIG. 1A. Memory array 500A is a variation of memory array 300 of FIG. 3A. Memory array 500A includes a first memory array 502 in place of first memory array 302, and a second memory array 504 in place of second memory array 304.

First memory array 502 is first memory array 302 (FIG. 3). Second memory array 504 is a variation of second memory array 304 (FIG. 3). Second memory array 504 includes a first portion 504a and a second portion 504b.

In some embodiments, data stored in the first portion 504a or the second portion 504b is a copy of the data stored in the first memory array 502. In some embodiments, data stored in the first portion 504a is a copy of the data stored in the second portion 504b. In some embodiments, data stored in the second memory array 504 includes an even number (e.g., an integer K being even) of copies of the data stored in the first memory array 502. In some embodiments, the data stored in the second memory array 504 includes an even number (e.g., integer K being even) of copies of the data in the first memory array 502.

The first portion 504a includes a second set of memory cells arranged in rows and columns. Each row of memory cells in the second set of memory cells includes a second set of memory words. For illustration, one row 525 of memory cells is shown, but the teachings of row 525 are applicable to each of the rows of memory cells in the first portion 504a of second memory array 504. A row 525 of memory cells in the second set of memory cells includes a second set of memory words W[1]', W[2]', W[3]' or W[4]' (collectively referred to as words "W'"). In some embodiments, each row of memory cells in the second set of memory cells has a corresponding row of memory cells in the first set of memory cells in first memory array 502. Common numbers of words W' in a row include 8, 16, 32, 64, or the like. A different number of words W' in a row of memory cells of the second set of memory cells is within the scope of various embodiments. Each word of the second set of memory words W' includes a plurality of memory cells or a plurality of memory bits. Word W[3]' includes a first set of bits 525a and a second set of bits 525b. For simplicity, memory bits in words W[1]', W[2]', and W[4]' are not shown. Each word in the second set of words W' has a corresponding word in the first set of words W.

In some embodiments, each word in the second set of words W' is configured with a second ECC 530 to provide error correction of at least a corresponding portion of a word in the second set of words W'. For simplicity, the second ECC 530 in each of words W[1]', W[2]' and W[4]' is not shown.

First set of bits 525a includes bits F1 . . . , FX, where X is a positive integer corresponding to the number of bits of data in first set of bits 525a in word W[3]'.

Second set of bits 525b includes bits G1 . . . , GZ, where Z is a positive integer corresponding to the number of bits in second set of bits 525b. Second set of bits 525b is referred to as a second ECC 530 configured to provide N-bits of error correction in the first set of bits 525a of word W[3]', where N is a positive integer. N corresponds to the number of bits of error correction provided by the second ECC 530 or third ECC 532. In some embodiments, the size of N is a design choice based upon the size of the second memory array 504. For example, in some embodiments, as the size of the second memory array 504 is increased, the size of N can also be increased since the second memory array 504 has more memory cells capable of storing more data. For example, in some embodiments, as the size of the second memory array 504 is decreased, the size of N can also be decreased since the second memory array 504 has less memory cells capable of storing less data. In some embodiments, first memory array 502 is not configured with first ECC 330 and first portion 504a is not configured with second ECC 530. In these embodiments, each of the words in the first set of words W does not include second set of bits 315b, and each of the words in the second set of words W' does not include second set of bits 525b.

In some embodiments, the number of memory cells in the second portion 504b is the same as the number of memory cells in the first portion 504a. The second portion 504b includes a third set of memory cells arranged in rows and columns. Each row of memory cells in the third set of memory cells includes a third set of memory words. For illustration, one row 535 of memory cells is shown, but the teachings of row 535 are applicable to each of the rows of memory cells in the second portion 504b of second memory array 504. A row 535 of memory cells in the third set of memory cells includes a third set of memory words W[1]", W[2]", W[3]" or W[4]" (collectively referred to as words "W'"). In some embodiments, each row of memory cells in the third set of memory cells has a corresponding row of memory cells in the first set of memory cells in first memory array 502 or a corresponding row of memory cells in the second set of memory cells in the first portion 504a of the second memory array 504. Common numbers of words W" in a row include 8, 16, 32, 64, or the like. A different number of words W" in a row of memory cells of the third set of memory cells is within the scope of various embodiments. Each word of the third set of memory words W" includes a plurality of memory cells or a plurality of memory bits. Word W[3]" includes a first set of bits 535a and a second set of bits 535b. For simplicity, memory bits in words W[1]", W[2]", and W[4]" are not shown. Each word in the third set of words W" has a corresponding word in the first set of words W or the second set of words W'.

First set of bits 535a includes bits F1' . . . , FX', where X' is a positive integer corresponding to the number of bits of data in first set of bits 535a in word W[3]".

Second set of bits 535b includes bits G1' . . . , GZ', where Z' is a positive integer corresponding to the number of bits in second set of bits 535b. Second set of bits 535b is referred to as a third ECC 532 configured to provide N-bits of error correction in the first set of bits 535a of word W[3]″, where N is a positive integer. In some embodiments, first portion 504a and second portion 504b are copies of the first memory array 502. In some embodiments, first memory array 502 is not configured with first ECC 330 and at least first portion 504a is not configured with second ECC 530 or second portion 504b is not configured with third ECC 532. In these embodiments, each of the words in the first set of words W does not include second set of bits 315b, and at least each of the words in the second set of words W′ does not include second set of bits 525b, or each of the words in the third set of words W″ does not include second set of bits 535b.

In some embodiments, row 525 or 535 is the same as row 315. In some embodiments, word W[3]′ or W[3]″ is different from word W[3]. In some embodiments, first set of bits 525a or 535a is a copy of first set of bits 315a. In some embodiments, second set of bits 525b or 535b is a copy of second set of bits 315b.

In some embodiments, at least one of first ECC 330, second ECC 530 or third ECC 532 is a same type of ECC as another of first ECC 330, second ECC 530 or third ECC 532. In some embodiments, at least one of first ECC 330, second ECC 530 or third ECC 532 is a different type of ECC as another of first ECC 330, second ECC 530 or third ECC 532. In some embodiments, second ECC 530 or third ECC 532 includes a Hamming ECC, a Reed-Solomon ECC, a BCH code, or the like. Other ECCs are within the scope of various embodiments. In some embodiments, if a size of the first portion 504a and a size of the second portion 504b are each at least equal to a size of the first memory array 502, then the size of the second memory array 504 is at least 200% greater than the size of the first memory array 502.

Figure 5B:
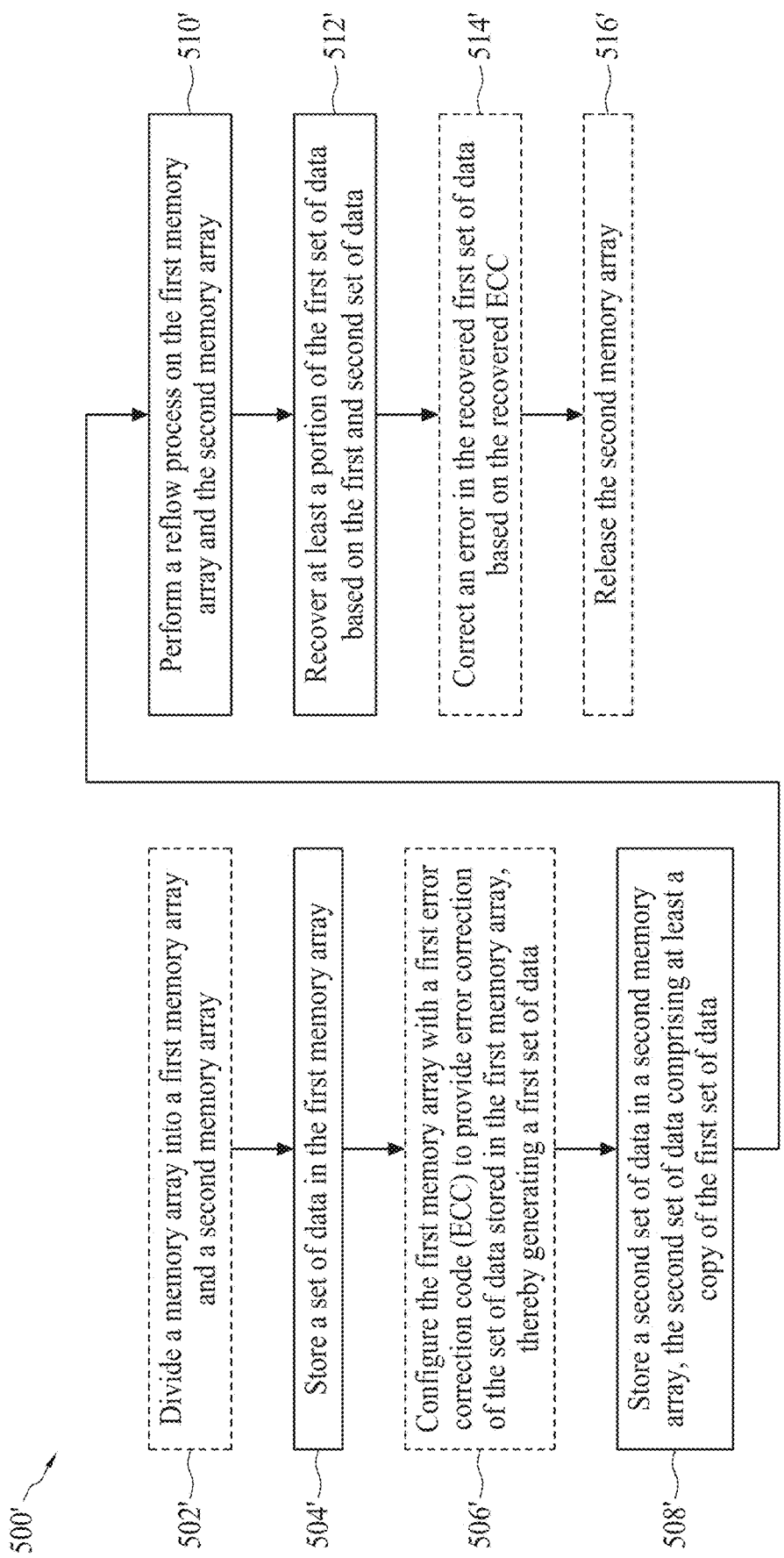
FIG. 5B is a flowchart of a method of correcting errors in a memory array, in accordance with some embodiments.

FIG. 5B is a flowchart of a method 500′ of correcting errors in a memory array 500 in accordance with some embodiments.

Method 500′ is an embodiment of method 200 of FIG. 2 with similar elements. For simplicity, method 500′ is applied to word W[3], word W[3]′ and word W[3]″ in FIG. 5A, but in some embodiments, method 500′ is applicable to each of the rows of memory cells in first memory array 502 or second memory array 504.

In operation 502′ of method 500′, a memory array 500 (FIG. 5A) is divided into a first memory array 502 and a second memory array 504. In some embodiments, a relationship between a size S2 of the second memory array 504 and a size S1 of the first memory array 502 is expressed by formula 2 or 3:

$$S1 \leq S2 < 2*S1 \quad (2)$$

$$S2 \geq K*S1 \quad (3)$$

where K is an even integer corresponding to the number of portions the second memory array 504 is divided into.

Figure 5C:
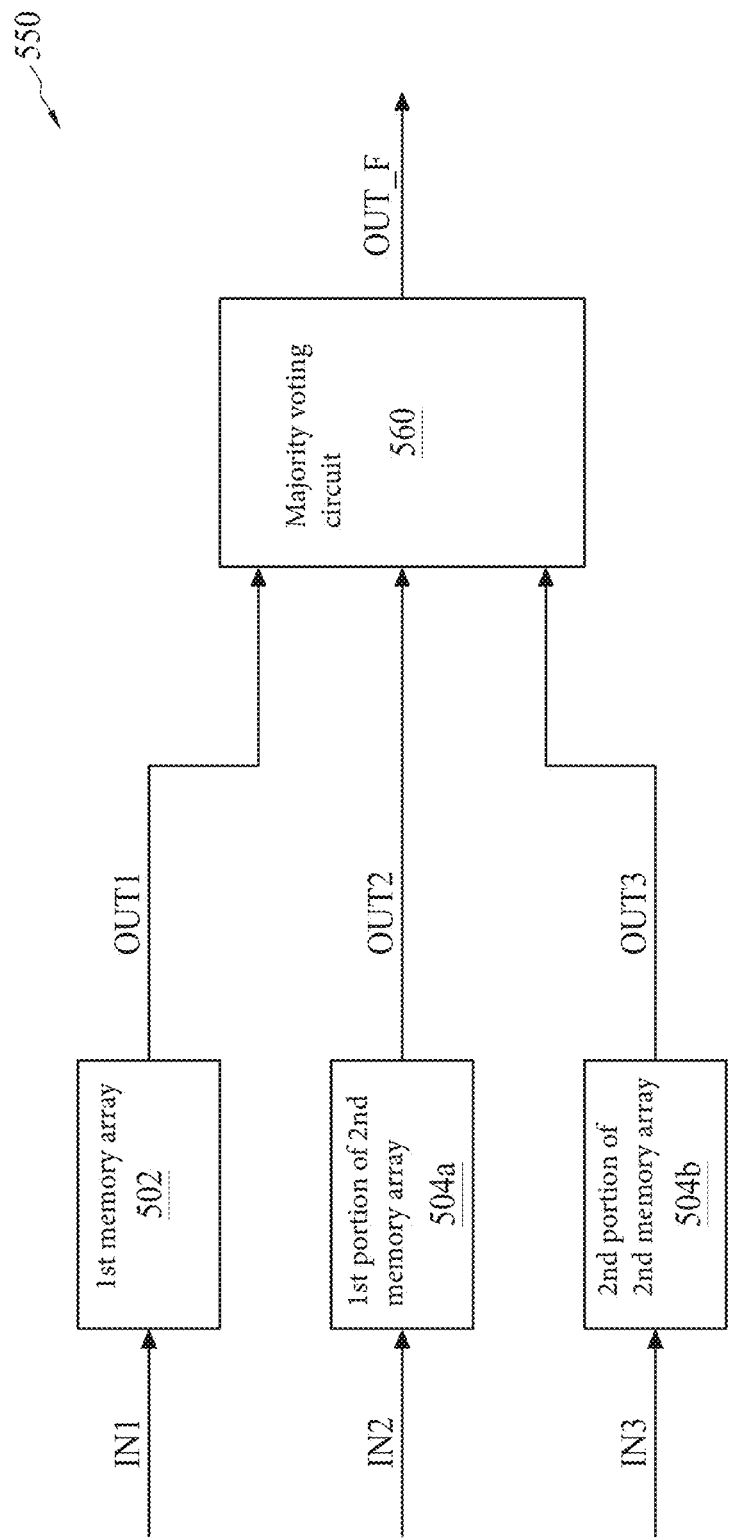
FIG. 5C is a block diagram of a system, in accordance with some embodiments.

In some embodiments, if the size S2 of the second memory array 502 satisfies formula 3, then operation 502′ comprises dividing the second memory array 504 into an even number (e.g., even integer K) of portions (e.g., first portion 504a and second portion 504b for K being equal to 2 in FIGS. 5A-5C). In some embodiments, a size of the first memory array 502 is less than or equal to $1/K^{th}$ of a size of the second memory array 504. In some embodiments, if a size S2 of the second memory array 504 satisfies formula 2, then the second memory array 504 includes a portion having a size at least equal to the size of the first memory array 502. In some embodiments, if a size S2 of the second memory array 504 satisfies formula 2, then the second memory array 504 is not divided into an even number of portions (e.g., even integer K). In some embodiments, each portion of the second memory array 504 stores copies of the data stored in first memory array 502.

Method 500′ continues with operation 504′, where a set of data (e.g., first set of bits 315a) is stored in the first memory array 502. In some embodiments, the set of data (e.g., first set of bits 315a) stored in the first memory array 502 is a portion of word W[3]. In some embodiments, IC 102 is configured to store the set of data (e.g., first set of bits 315a) in the first memory array 502. In some embodiments, configuration system 104 is configured to store the set of data (e.g., first set of bits 315a) in the first memory array 502.

In some embodiments, the set of data (e.g., first set of bits 315a) includes addresses of memory cells in first memory array 502.

Method 500′ continues with operation 506′, where the first memory array 502 is configured with first ECC 330 to provide error correction of the set of data (e.g., first set of bits 315a) stored in the first memory array 502 thereby generating a first set of data (e.g., first set of bits 315a and second set of bits 315b). In some embodiments, configuration system 104 configures the first memory array 502 with the first ECC 330. The first ECC 330 is stored in the first memory array 502 as the second set of bits 315b. In some embodiments, the first set of data comprises first set of bits 315a and second set of bits 315b. In some embodiments, operation 506′ is not performed. For example, in some embodiments, the first memory array 502 is not configured with the first ECC 330, and therefore the first set of data of method 500′ corresponds to the set of data.

Method 500′ continues with operation 508′, where a second set of data is stored in the second memory array 504. In some embodiments, the second set of data includes at least a copy of the first set of data (e.g., first set of bits 315a and second set of bits 315b).

In some embodiments, the second set of data includes at least first set of bits 525a or first set of bits 535a. In some embodiments, the first memory array 502 is configured with the first ECC 330, and at least the first portion 504a or the second portion 504b of second memory array is configured with ECC protection (e.g., second ECC 530 or third ECC 532). In some embodiments, if at least the first portion 504a or the second portion 504b of second memory array is configured with ECC protection, the second set of data includes at least first set of bits 525a, first set of bits 535a, second set of bits 525b or second set of bits 535b. In some embodiments, the first memory array 502 is not configured with the first ECC 330, and therefore, in these embodiments, the second set of data of method 500′ does not have ECC protection. In some embodiments, if the second set of data is not configured with ECC protection, the second set of data does not include one or more of second set of bits 525b or 535b.

In some embodiments, if the size S2 of the second memory array 504 satisfies formula 2, then operation 508′ comprises storing a copy of the first set of data as the second set of data in second memory array 504. In some embodiments, if the size S2 of the second memory array 502 satisfies formula 3, then operation 508′ comprises dividing the second memory array 504 into an even number (e.g., even integer K) of portions (e.g., first portion 504a and second portion 504b for even integer K being equal to 2 in FIGS. 5A-5C), and saving a copy of the first set of data into each corresponding portion (e.g., first portion 504a and second portion 504b) of the second memory array 504. In some embodiments, operation 508′ comprises saving a copy of the first set of data into each corresponding portion (e.g., first portion 504a and second portion 504b) of the second memory array 504. In some embodiments, the second set of data comprises an even number (e.g., even integer K) of copies of the first set of data (e.g., first set of bits 315a). In some embodiments, the second set of data comprises an even number (e.g., even integer K) of copies of data stored in at least word W[3].

Method 500' continues with operation 510', where a reflow process is performed on the first memory array 502 and the second memory array 504. The reflow process of operation 510' is the reflow process of operation 204 of FIG. 2, operation 310' of FIG. 3B or operation 416' of FIG. 4C. In some embodiments, the reflow process of operation 510' corrupts portions of the data stored in the first memory array 502 or second memory array 504. In some embodiments, the reflow process of operation 510' corrupts memory cells in the first memory array 502 or the second memory array 504 such that the corrupted memory cells do not properly store data.

Method 500' continues with operation 512', where a portion of the first set of data (e.g., first set of bits 315a and second set of bit 315b) stored in the first memory array 502 is recovered. In some embodiments, the recovered first set of data is output signal OUT_F (FIG. 5C). In some embodiments, the recovered first set of data has a recovered ECC (if applicable). In some embodiments, the recovered first set of data (e.g., output signal OUT_F (FIG. 5C)) of operation 512' is generated based on a majority bit voting of the first set of data (e.g., first set of bits 315a and second set of bit 315b) and the second set of data (e.g., first set of bits 525a or 535a, or second set of bits 525b or 535b). In some embodiments, the recovered first set of data includes at least a portion (e.g., first set of bits 315a and second set of bit 315b) of the first set of data. In some embodiments, the recovered first set of data includes at least a corrected version of the first set of bit 315a or a corrected version of the first ECC 330.

In some embodiments, the first memory array 502 and the second memory array 504 are configured in an L-modular redundancy system that implements the majority bit voting of operation 512', where L is a positive integer corresponding to the number of redundant elements in the L-modular redundancy system. For example, in some embodiments, if integer L is equal to 3, then the first memory array 502 and the second memory array 504 are configured in a triple-modular redundancy system 550 (shown in FIG. 5C) that implements the majority bit voting of operation 512'. In some embodiments, integer L is equal to integer K+1 of operation 502' or 508'. In some embodiments, in an L-modular redundancy system, for each bit of data, if data from one of the L-systems (e.g., first memory array 502 and second memory array 504) is incorrect, then data from the remaining L-systems (e.g., first memory array 502 and second memory array 504) is used to correct the incorrect data. In some embodiments, the majority bit voting of operation 512' is performed on a bit-by-bit basis for the first set of data and second set of data.

In some embodiments, operation 512' comprises generating a first set of output signals by performing at least one AND operation between the first set of data (e.g., first set of bits 315a and second set of bit 315b) and the second set of data (e.g., first set of bits 525a or 535a, or second set of bits 525b or 535b), for each bit of data, and performing an OR operation on the first set of output signals.

In some embodiments, the first ECC 330 of the first set of data or the second ECC 530 of the second set of data do not contain any errors and are not recovered or corrected. In some embodiments, the first ECC 330 of the first set of data or the second ECC 530 of the second set of data contain errors and is recovered or corrected by an ECC engine (not shown) in IC 102. In some embodiments, if the size S2 of the second memory array 504 satisfies formula 2, then the first and second set of data includes one or more errors if they contain different data. In these embodiments, if the number of errors in the second set of data is less than the number of errors in the first set of data, then the second set of data (e.g., first set of bits 525a and the recovered second ECC 530) are copied to the first memory cell array 502 as the recovered first set of data. In these embodiments, if the number of errors in the first set of data is less than the number of errors in the second set of data, then the first set of data (e.g., first set of bits 325a and the recovered first ECC 330) corresponds to the recovered first set of data. In these embodiments, if the ECC is not recovered, then the first ECC 330 or the second ECC 530 replaces the recovered ECC.

Method 500' continues with operation 514', where a portion of the recovered first set of data (e.g., output signal OUT_F (FIG. 5C)) stored in the first memory array 502 is corrected based on an ECC (e.g., first ECC 330, second ECC 530 or third ECC 532). In some embodiments, the ECC of operation 514' is a recovered ECC. In some embodiments, if the first ECC 330 is not corrected in operation 512', then a portion of the recovered first set of data (e.g., output signal OUT_F (FIG. 5C)) of operation 514' is recovered or corrected based on the first ECC 330.

In some embodiments, the recovered first set of data of operation 514' includes at least a portion of first set of bits 315a and a portion of second set of bits 315b. In some embodiments, the recovered first set of data includes a word of the first set of words W in the first memory array 502. In some embodiments, if the number of errors in at least a portion of a word of the first set of words W in the first memory array 502 is less than or equal to N bits, then the data (e.g., first set of bits 315a) stored at the word of the first set of words W in first memory array 502 is corrected based on the recovered first ECC 330. In some embodiments, if the number of errors in at least a portion of a word of the first set of words W in the first memory array 502 is greater than N bits, then the data (e.g., first set of bits 315a or second set of bits 315b) stored at the word of the first set of words in the first memory array 502 is not corrected based on the recovered first ECC 330.

Method 500' continues with operation 516', where at least a portion of the second memory array 504 is released. In some embodiments, operation 516' comprises designating at least a portion of the second memory array 504 as memory cells capable of being written to by IC 102 or other circuits.

In some embodiments, one or more of operations 502', 506', 514' or 516' is not performed.

Figure 6:
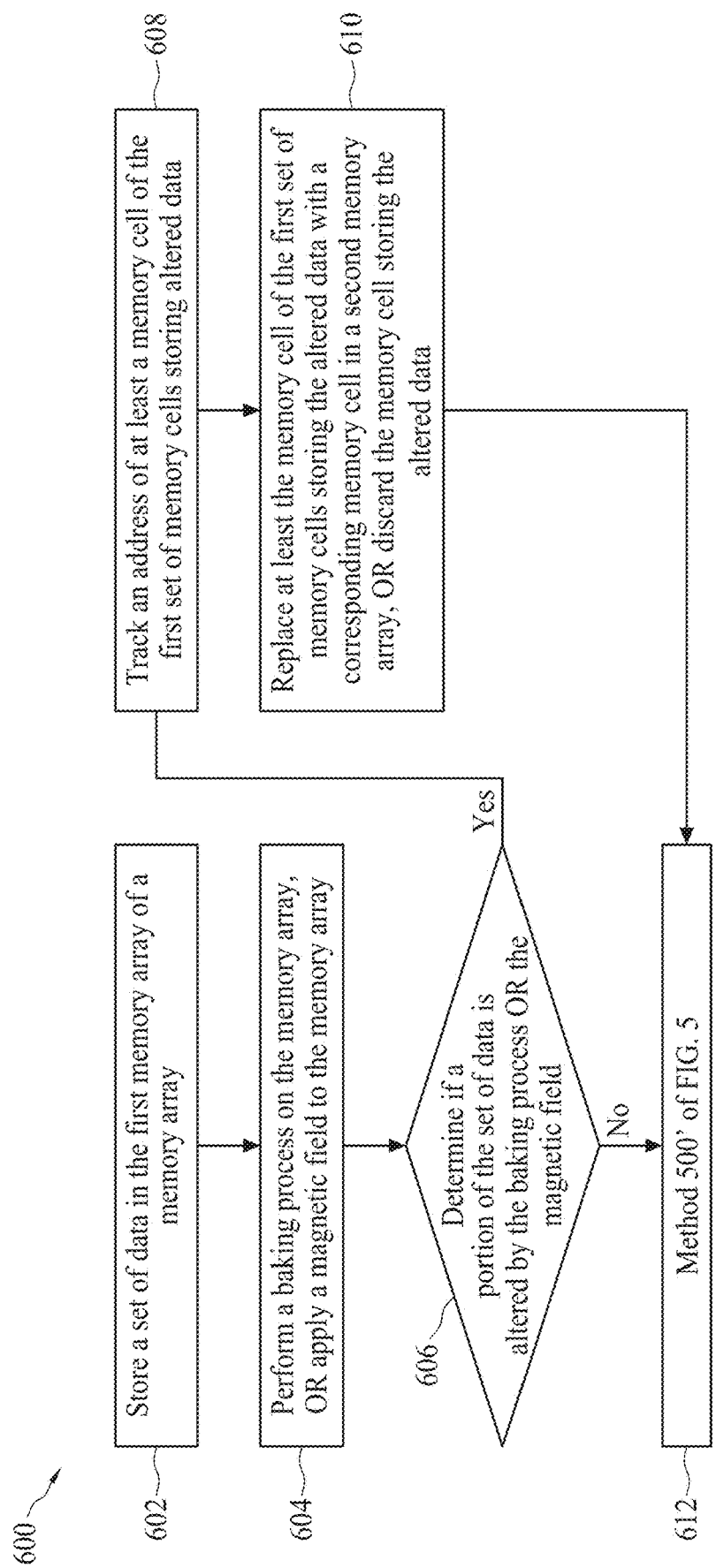
FIG. 6 is a flowchart of a method of correcting errors in a memory array, in accordance with some embodiments.

It is understood that additional operations may be performed before, during, and/or after method 300' depicted in FIG. 3B, method 400' depicted in FIG. 4C, method 500' depicted in FIG. 5B or method 600 depicted in FIG. 6, and that some other operations may only be briefly described herein.

FIG. 5C is a block diagram of a system 550, in accordance with some embodiments.

System 550 includes a majority voting circuit 560 being electrically coupled to each of first memory array 502, first portion 504a of second memory array 504 and second portion 504b of second memory array 504. In some embodiments, system 550 includes other circuitry or is configured to store or execute software, which, for simplicity, is not shown. System 550 is part of IC 102 of FIG. 1. In some embodiments, system 550 is part of configuration system 104 of FIG. 1.

System 550 is a triple-modular redundancy system configured to implement the majority bit voting of operation 520' of FIG. 5B when integers K and L are equal to 3. In some embodiments, system 550 is configured to repair or detect an error in data stored in first memory array 502.

The first memory array 502 is configured to store input data IN1. In some embodiments, input data IN1 is the first set of data of operation 504'.

The first portion 504a of the second memory array 504 is configured to store a first copy IN2 of the input data IN1. The second portion 504b of the second memory array 504 is configured to store a second copy IN3 of the input data IN1. In some embodiments, first copy IN2 and second copy IN3 are the second set of data of operation 508'.

A read operation is performed by system 550 on the data stored in the first memory array 502 and the first portion 504a and the second portion 504b. In some embodiments, the majority voting circuit 560 is configured to perform the read operation on the first memory array 502, the first portion 504a and the second portion 504b.

Majority voting circuit 560 is configured to receive signals OUT1, OUT2 and OUT3. Signals OUT1, OUT2 and OUT3 are the data read from the corresponding first memory array 502, first portion 504a and second portion 504b. Majority voting circuit 560 is configured to generate output signal OUT_F based on signals OUT1, OUT2 and OUT3. Majority voting circuit 560 is a logic circuit configured to determine (or correct), on a bit-by-bit basis, if an error is present in the data stored in first memory array 502, first portion 504a and second portion 504b. Output signal OUT_F is a low logical value represented by "0" or a high logical value represented by "1".

In some embodiments, majority voting circuit 560 is configured to compare each bit of data stored within the first memory array 502 and the second memory array 504, bit-by-bit, to determine if an error is present in the data (e.g., input data IN1, first copy IN2 and second copy IN3) stored in first memory array 502, first portion 504a and second portion 504b. In some embodiments, determining if an error is present, bit-by-bit, for each bit of data within the first memory array 502 and the second memory array 504 is implemented using formula 4 below. In some embodiments, for each bit of data, if the bits of data stored in the first memory array 502 and the second memory array 504 are corrupted or inconsistent with each other, then correct data in the other two memory arrays are utilized to correct the inconsistency or error.

In some embodiments, the majority voting circuit 560 is an AND-OR logic circuit configured to generate output signal OUT_F. In these embodiments, output signal OUT_F is equal to the expression of formula 4:

$$OUT\_F = (OUT1 \text{ and } OUT2) \text{ OR } (OUT2 \text{ and } OUT3) \text{ OR } (OUT1 \text{ and } OUT3) \quad (4)$$

In these embodiments, for each bit in input data IN1 stored in the first memory array 502, majority voting circuit 560 detects and corrects a single bit error in input data IN1, first copy IN2 or second copy IN3. In some embodiments, for a bit of data stored in the first memory array 502, the output signal OUT_F of majority voting circuit 560 is a logical "1" if two or more of signals OUT1, OUT2 or OUT3 are a logical "1". In some embodiments, for a bit of data stored in the first memory array 502, output signal OUT_F of majority voting circuit 560 is a logical "0" if two or more of signals OUT1, OUT2 or OUT3 are a logical "0". For example, in these embodiments, if input data IN1, first copy IN2, second copy IN2, OUT1, OUT2 and OUT3 are equal to each other, then output signal OUT_F is equal to signal OUT1, OUT2 or OUT3 and no errors are present in signals OUT1, OUT2 and OUT3. In these embodiments, if a single bit error is present in input data IN1, first copy IN2, second copy IN2, OUT1, OUT2 or OUT3, then one of signals OUT1, OUT2 or OUT3 will have a different value from the other of signals OUT1, OUT2 or OUT3, but the majority voting circuit 560 will correct the single error based on the AND-OR logic operation expressed by formula 4.

FIG. 6 is a flowchart of a method 600 of correcting errors in a memory array 500 in accordance with some embodiments.

Method 600 is an embodiment of method 200 of FIG. 2 with similar elements. For simplicity, method 600 is applied to word W[3], word W[3]' and word W[3]" in FIG. 5A, but in some embodiments, method 600 is applicable to each of the rows of memory cells in first memory array 502 or second memory array 504. Method 600 is a variation of method 500' of FIG. 5B.

In operation 602 of method 600, a set of data (e.g., first set of bits 315a) is stored in the first memory array 502 of memory array 500. In some embodiments, the set of data (e.g., first set of bits 315a) stored in the first memory array 502 is a portion of word W[3]. In some embodiments, IC 102 is configured to store the set of data (e.g., first set of bits 315a) in the first memory array 502. In some embodiments, configuration system 104 is configured to store the set of data (e.g., first set of bits 315a) in the first memory array 502. In some embodiments, the set of data (e.g., first set of bits 315a) stored in the first memory array 502 is a first data type. In some embodiments, the first data type is a set of high logical values or "1's". In some embodiments, the first data type is a set of low logical values or "0's".

Method 600 continues with operation 604, where (i) a baking process is performed on memory array 500, or (ii) a magnetic field is applied to memory array 500.

In some embodiments, the baking process includes placing memory array 500 into an oven, and heating the oven at a temperature T2 for a duration D2. In some embodiments, heating the oven at temperature T2 for duration D2 includes heating the memory array 500 at temperature T2. In some embodiments, temperature T2 of the baking process of operation 606 is greater than or equal to temperature T1 of the reflow process of operation 510' of method 500'. In some embodiments, duration D2 of the baking process of operation 606 is greater than or equal to duration D1 of the reflow process of operation 510' of method 500'.

In some embodiments, the magnetic field applied to memory array 500 has a strength ranging from about 500 oersted (Oe) to about 2000 Oe. In some embodiments, the magnetic field is applied to memory array 500 for a duration D2 ranging from about 1 second to about 10 second. In some embodiments, determining a lower boundary of the magnetic field strength (e.g., 500 Oe) or a lower boundary on the duration (e.g., 1 second) applied to memory array 500 is based on setting a magnetic field strength and a corresponding duration capable of altering the data stored in memory array 500. In some embodiments, magnetic field strengths or durations less than the corresponding lower boundaries do not alter data in memory array 500. In some embodiments, determining an upper boundary of the magnetic field strength (e.g., 20000 Oe) or an upper boundary on the duration (e.g., 10 seconds) applied to memory array 500 is based on setting a magnetic field strength and a corresponding duration capable of altering the data stored in memory array 500, but not to damage the memory cells within memory array 500. In some embodiments, magnetic fields or durations greater than the upper boundary alter data in memory array 500, but they also damage memory array 500. Other magnetic field strengths or durations are within the scope of various embodiments.

Method 600 continues with operation 606, where a determination is made if at least a portion of the set of data (e.g., first set of bits 315a) is altered by the baking process, or the applied magnetic field of operation 604. If at least a portion of the set of data (e.g., first set of bits 315a) is determined to have been altered by the baking process or the applied magnetic field, then method 600 proceeds to operation 608. If the set of data (e.g., first set of bits 315a) is determined to have not been altered by the baking process or the applied magnetic field, then method 600 proceeds to operation 612. In some embodiments, the one or more memory cells containing altered data are referred to as a first set of memory cells of first memory array 502.

In some embodiments, an altered set of data includes a set of bits with an opposite logical value from the logical value of the bits in the set of data. For example, in some embodiments, if the set of data corresponds to a set of high logical values, then the altered set of data includes a set of bits with low logical values. Similarly, in some embodiments, if the set of data corresponds to the set of low logical values, then the altered set of data includes a set of bits with high logical values.

Method 600 continues with operation 608, where an address of at least a memory cell of the first set of memory cells storing altered data is tracked. In some embodiments, an address of a tracked memory cell is recorded in a database (e.g., memory 704 of system 700 (FIG. 7)). In some embodiments, memory cells containing altered data are referred to as "weak bits."

Method 600 continues with operation 610, where the memory cell of the first set of memory cells storing the altered data is replaced with a corresponding memory cell in the second memory array 504, or the memory cell of the first set of memory cells storing the altered data is discarded. In some embodiments, a discarded memory cell is a memory cell not used in first memory array 502. In some embodiments, a discarded memory cell is a memory cell removed from IC 102. In some embodiments, operations 606, 608 and 610 are repeated for each memory cell of the first set of memory cells storing altered data.

In some embodiments, operations 602-610 are utilized to screen out memory cells in the first memory array 502 that are characterized as "weak bits." In some embodiments, operations 602-610 are repeated. For example, in some embodiments, operations 602-610 are applied to memory array 500 when the set of data corresponds to a set of high logical values to screen out memory cells in first memory array 502 that are susceptible to transitioning from high logical values to low logical values from the baking process or magnetic field of operation 604. In these embodiments, operations 602-610 are again applied to memory array 500, but the set of data corresponds to a set of low logical values to screen out memory cells that are susceptible to transitioning from low logical values to high logical values from the baking process or magnetic field of operation 604. Other configurations of the set of data is within the scope of the present disclosure.

In some embodiments, when operations 602-610 are repeated, the baking process for the first iteration is the same as the baking process for the second iteration. In some embodiments, when operations 602-610 are repeated, the baking process for the first iteration is different from the baking process for the second iteration. In some embodiments, when operations 602-610 are repeated, applying the magnetic field for the first iteration is the same as applying the magnetic field for the second iteration. In some embodiments, when operations 602-610 are repeated, applying the magnetic field for the first iteration is different from applying the magnetic field for the second iteration. Other configurations of the baking process or applying the magnetic field is within the scope of the present disclosure.

Method 600 continues with operation 612. Operation 612 of method 600 corresponds to method 500' of FIG. 5B which, in some embodiments, corrects errors in memory array 500.

Method 600 can identify and screen out weak bits in memory array 500 resulting in memory array 500 having a lower bit error rate (BER) and a lower field return rate than other approaches.

The sequence in which the operations of method 200, 300', 400C, 500' or 600 are for illustration only; the operations of 200, 300', 400C, 500' or 600 are capable of being executed in sequences that differ from that depicted in corresponding FIG. 2, 3B, 4C, 5B or 6. In some embodiments, operations in addition to those depicted in FIG. 2, 3B, 4C, 5B or 6 are performed before, between and/or after the operations depicted in FIG. 2, 3B, 4C, 5B or 6. Using at least one of the presently disclosed methods, the error correcting advantages in a memory array (e.g., memory array 102a, memory array 300 of FIG. 3A, memory array 400A of FIG. 4A, memory array 400B of FIG. 4B or memory array 500 of FIG. 5A) are greater than other approaches because the memory array (e.g., memory array 102a, memory array 300 of FIG. 3A, memory array 400A of FIG. 4A, memory array 400B of FIG. 4B or memory array 500 of FIG. 5A) is configured with error correction codes (e.g., first ECC 330, second ECC 332, 432, 434, 530 or third ECC 532) and/or parity (e.g., first parity check 420 or 424, or second parity check 422) in portions of the memory array that are not used in other approaches. In these embodiments, by using error correction codes (e.g., first ECC 330, second ECC 332, 432, 434, 530 or third ECC 532) and/or parity (e.g., first parity check 420 or 424, or second parity check 422), memory array (e.g., memory array 102a, 300, 400A, 400B or 500) has a lower bit error rate (BER) and lower field return rate than other approaches.

FIG. 7 is a block diagram of a system 700 for configuring memory array 102a in accordance with some embodiments. System 700 includes a hardware processor 702 and a non-transitory, computer readable storage medium 704 encoded with, i.e., storing, the computer program code 706, i.e., a set of executable instructions. The computer program code 706 is configured to interface with integrated circuit 102 for configuring memory array 102a with various ECC configurations. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements by network 714. The processor 702 is configured to execute the computer program code 706 encoded in the computer readable storage medium 704 in order to cause system 700 to be usable for performing a portion or all of the operations as described in method 200, 300', 400C, 500' or method 600. In some embodiments, system 700 is system 550 of FIG. 5C.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores the computer program code 706 configured to cause system 700 to perform method 200, 300', 400C, 500' or 600. In some embodiments, the storage medium 704 also stores information needed for performing a method 200, 300', 400C, 500' or 600 as well as information generated during performing the method 200, 300', 400C, 500' or 600, such as first ECC 716, second ECC 718, third ECC 720, first parity check 722, second parity check 724, and configurations 626, and/or a set of executable instructions to perform the operation of method 200, 300', 400C, 500' or 600.

In some embodiments, the storage medium 704 stores the computer program code 706 for interfacing with memory devices. The computer program code 706 enable processor 702 to generate instructions readable by integrated circuit 102 to effectively implement method 200, 300', 400C, 500' or 600 during a memory configuration process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 200, 300', 400C, 500' or 600 is implemented in two or more systems 700, and information such as first ECC, second ECC, third ECC, first parity check, second parity check and configurations are exchanged between different systems 700 by network 714.

System 700 is configured to receive information related to a first ECC through I/O interface 710 or network interface 712. The information is transferred to processor 702 by bus 708 to determine a first ECC for configuring integrated circuit 102. The first ECC is then stored in computer readable medium 704 as first ECC 716. System 700 is configured to receive information related to a second ECC through I/O interface 710 or network interface 712. The information is stored in computer readable medium 704 as second ECC 718. System 700 is configured to receive information related to a third ECC through I/O interface 710 or network interface 712. The information is stored in computer readable medium 704 as third ECC 720. System 700 is configured to receive information related to a first parity check through I/O interface 710 or network interface 712. The information is stored in computer readable medium 704 as first parity check 722. System 700 is configured to receive information related to a second parity check through I/O interface 710 or network interface 712. The information is stored in computer medium 704 as second parity check 724. System 700 is configured to receive information related to memory configurations through I/O interface 710 or network interface 712. The information is stored in computer readable medium 704 as configurations 726.

One aspect of this description relates to a method of screening weak bits in a memory array in a memory array. In some embodiments, the method includes storing a first set of data in a first memory array of the memory array, the first memory array having a first set of memory cells; performing a first baking process on at least the first memory array, or applying a first magnetic field to at least the first memory array; determining if a portion of the first set of data stored in the first memory array is altered by the first baking process or the first magnetic field; and tracking an address of at least a first memory cell of the first set of memory cells, if the first memory cell of the first set of memory cells stores altered data, and at least one of the following operations: replacing the first memory cell of the first set of memory cells storing the altered data with a corresponding memory cell in a second memory array of the memory array, or discarding the first memory cell of the first set of memory cells storing the altered data.

Another aspect of this description relates to method of correcting errors in a memory array. The method includes dividing the memory array into a first memory array and a second memory array; configuring the first memory array with a first error correction code (ECC) to provide error correction of data stored in the first memory array, the first memory array including a first set of memory cells arranged in rows and columns, a row of memory cells in the first set of memory cells includes a first set of memory words, each word of the first set of memory words includes a first set of bits; configuring a first portion of the second memory array with a first parity check configured to provide error detection of the data stored in the rows of the first memory array, the first portion of the second memory array including a second set of memory cells storing a first set of data; configuring the first portion of the second memory array with a second ECC to provide error correction of the first set of data stored in the first portion of the second memory array, the first set of data having a first set of parity bits; performing a reflow process on the first memory array and the second memory array; reading at least the data stored in the first memory array or the first set of data stored in the second memory array; and correcting at least a portion of the data stored in the first memory array based on at least the first ECC, or the first parity check.

Still another aspect of this description relates to method of correcting errors in a memory array. The method includes screening weak bits in a first memory array of the memory array, the first memory array including a first set of memory cells arranged in rows and columns, a row of memory cells in the first set of memory cells includes a first set of memory words, each word of the first set of memory words includes a first set of bits; storing a set of data in the first memory array; configuring the first memory array with a first error correction code (ECC) to provide error correction of the set of data stored in the first memory array thereby generating a first set of data; storing a second set of data in a second memory array, the second set of data comprising at least a copy of the first set of data, the second memory array including a second set of memory cells arranged in rows and columns; performing a reflow process on the first memory array and the second memory array; reading at least the second set of data stored in the second memory array; recovering at least a portion of the first set of data based on the first set of data and the second set of data; and correcting an error in the recovered first set of data based on an ECC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of screening weak bits in a memory array, the method comprising:
    dividing the memory array into a first memory array and a second memory array;
    storing a first set of data in the first memory array of the memory array, the first memory array having a first set of memory cells;
    performing a first baking process on at least the first memory array, or applying a first magnetic field to at least the first memory array;
    determining that a portion of the first set of data stored in the first memory array is altered by the first baking process or the first magnetic field; and
    tracking an address of at least a first memory cell of the first set of memory cells, in response to the first memory cell of the first set of memory cells storing altered data, and at least one of:
        replacing the first memory cell of the first set of memory cells storing the altered data with a corresponding memory cell in the second memory array of the memory array, or
        not using the first memory cell of the first set of memory cells storing the altered data.

2. The method of claim 1, further comprising:
    storing a second set of data in the first memory array;
    performing a second baking process on at least the first memory array, or applying a second magnetic field to at least the first memory array;
    determining that a portion of the second set of data stored in the first memory array is altered by the second baking process or the second magnetic field; and
    tracking an address of at least a second memory cell of the first set of memory cells, in response to the second memory cell of the first set of memory cells storing altered data, and at least one of:
        replacing the second memory cell of the first set of memory cells storing the altered data with a corresponding memory cell in the second memory array of the memory array, or
        not using the second memory cell of the first set of memory cells storing the altered data.

3. The method of claim 2, wherein
    the first set of data is logically inverted from the second set of data.

4. The method of claim 3, wherein
    each datum of the first set of data is a low logical value or a high logical value.

5. The method of claim 2, wherein performing the first baking process comprises:
    placing the memory array into an oven, and heating the oven at a first temperature for a first duration.

6. The method of claim 5, wherein performing the second baking process comprises:
    placing the memory array into the oven, and heating the oven at a second temperature for a second duration, and at least one of the following:
    the first temperature is equal to the second temperature; or
    the first duration is equal to the second duration.

7. The method of claim 2, wherein applying the first magnetic field comprises:
    applying the first magnetic field having a first strength for a first duration.

8. The method of claim 7, wherein applying the second magnetic field comprises:
    applying the second magnetic field having a second strength for a second duration, and at least one of the following:
    the first strength is equal to the second strength; or
    the first duration is equal to the second duration.

9. A method of correcting errors in a memory array, the method comprising:
    dividing the memory array into a first memory array and a second memory array;
    configuring the first memory array with a first error correction code (ECC) to provide error correction of data stored in the first memory array, the first memory array including a first set of memory cells arranged in rows and columns, a row of memory cells in the first set of memory cells includes a first set of memory words, each word of the first set of memory words includes a first set of bits;
    configuring a first portion of the second memory array with a first parity check configured to provide error detection of the data stored in the rows of the first memory array, the first portion of the second memory array including a second set of memory cells storing a first set of data;
    configuring the first portion of the second memory array with a second ECC to provide error correction of the first set of data stored in the first portion of the second memory array, the first set of data having a first set of parity bits;
    performing a reflow process on the first memory array and the second memory array;
    reading at least the data stored in the first memory array or the first set of data stored in the second memory array; and
    correcting at least a portion of the data stored in the first memory array based on at least
    the first ECC.

10. The method of claim 9, further comprising:
    reading the first set of data stored in the second memory array thereby correcting the first set of data stored in the first portion of the second memory array based on the second ECC.

11. The method of claim 9, further comprising:
    configuring a second portion of the second memory array with a second parity check configured to provide error detection of the data stored in the columns of the first memory array, the second portion of the second memory array including a third set of memory cells storing a second set of data;
    wherein correcting at least the portion of the data stored in the first memory array further comprises:

correcting at least the portion of the data stored in the first memory array based on at least the first parity check and the second parity check.

12. The method of claim 11, wherein the correcting at least the portion of the data stored in the first memory array based on at least the first ECC, or the first parity check and the second parity check comprises:
correcting N bit errors in the word of the first set of memory words based on the first ECC, where N is a positive integer corresponding to a number of bits error protection provided by the first ECC in at least the word of the first set of memory words; and
correcting a single bit error in the word of the first set of memory words based on combining the first parity check and the second parity check.

13. The method of claim 11, further comprising:
configuring the second portion of the second memory array with a third ECC to provide error correction of the second set of data stored in the second portion of the second memory array; and
reading the second set of data stored in the second memory array thereby correcting the second set of data stored in the second portion of the second memory array based on the third ECC.

14. The method of claim 13, wherein
the first ECC is an N-bit ECC, where N is a positive integer corresponding to a number of bits of error protection provided by the first ECC in at least a word of the first set of memory words;
the second ECC is an N1-bit ECC, where N1 is a positive integer corresponding to a number of bits of error protection provided by the second ECC in the first set of data; and
the third ECC is an N2-bit ECC, where N2 is a positive integer corresponding to a number of bits of error protection provided by the third ECC in the second set of data.

15. A method of correcting errors in a memory array, the method comprising:
dividing the memory array into a first memory array and a second memory array;
screening weak bits in the first memory array of the memory array, the first memory array including a first set of memory cells arranged in rows and columns, a row of memory cells in the first set of memory cells includes a first set of memory words, each word of the first set of memory words includes a first set of bits;
storing a set of data in the first memory array;
configuring the first memory array with a first error correction code (ECC) to provide error correction of the set of data stored in the first memory array thereby generating a first set of data;
storing a second set of data in the second memory array, the second set of data comprising at least a copy of the first set of data, the second memory array including a second set of memory cells arranged in rows and columns;
performing a reflow process on the first memory array and the second memory array;
reading at least the second set of data stored in the second memory array;
recovering at least a portion of the first set of data based on the first set of data and the second set of data; and
correcting an error in the recovered first set of data based on an ECC.

16. The method of claim 15, wherein recovering at least the portion of the first set of data based on the first set of data and the second set of data comprises:
recovering the first set of data based on a majority bit voting of the first set of data and the second set of data.

17. The method of claim 16, wherein recovering the first set of data based on the majority bit voting of the first set of data and the second set of data comprises:
generating a first set of output signals by performing at least one AND operation between the first set of data and the second set of data, for each bit of data; and
performing an OR operation on the first set of output signals.

18. The method of claim 15, wherein screening weak bits in the first memory array of the memory array comprises:
storing a third set of data in the first memory array of the memory array;
performing a first baking process on at least the first memory array, or applying a first magnetic field to at least the first memory array;
determining that a portion of the third set of data stored in the first memory array is altered by the first baking process or the first magnetic field; and
tracking an address of at least a first memory cell of the first set of memory cells, in response to the first memory cell of the first set of memory cells storing altered data.

19. The method of claim 18, wherein screening weak bits in the first memory array of the memory array further comprises:
replacing the first memory cell of the first set of memory cells storing the altered data with a corresponding memory cell in a third memory array of the memory array.

20. The method of claim 18, wherein screening weak bits in the first memory array of the memory array further comprises:
not using the first memory cell of the first set of memory cells storing the altered data.

* * * * *